United States Patent [19]

Milligan

[11] Patent Number: 4,590,422
[45] Date of Patent: May 20, 1986

[54] AUTOMATIC WAFER PROBER HAVING A PROBE SCRUB ROUTINE

[75] Inventor: Vernon C. Milligan, Los Altos, Calif.

[73] Assignee: Pacific Western Systems, Inc., Mountain View, Calif.

[21] Appl. No.: 288,454

[22] Filed: Jul. 30, 1981

[51] Int. Cl.$^4$ .................. G01R 31/02; G01R 1/06; B24B 7/00; B08B 7/00
[52] U.S. Cl. ............................. 324/158 F; 15/1; 51/5 R; 51/281 R; 134/6; 324/158 P
[58] Field of Search .............. 324/158 P, 158 F, 72.5; 15/1; 134/6, 18, 37, 42; 51/3, 5 R, 281 R

[56] References Cited

U.S. PATENT DOCUMENTS 3,996,517 12/1976 Fergason et al. ............... 324/158 P Primary Examiner—Ernest F. Karlsen
Attorney, Agent, or Firm—Harry E. Aine

[57] ABSTRACT

In an automatic wafer prober, the prober steps through a certain predetermined sequence of die on the wafer. After a certain predetermined number of die have been probed, the prober automatically interrupts the probing sequence and steps the prober off of the wafer onto an abrasive element for scrubbing clean the probe tips. Thereafter, the prober returns to its predetermined probing sequence. The abrasive element is preferably fixidly secured to the wafer chuck. A flat of the abrasive element serves as an alignment flat for registration with a flat of the wafer.

10 Claims, 30 Drawing Figures

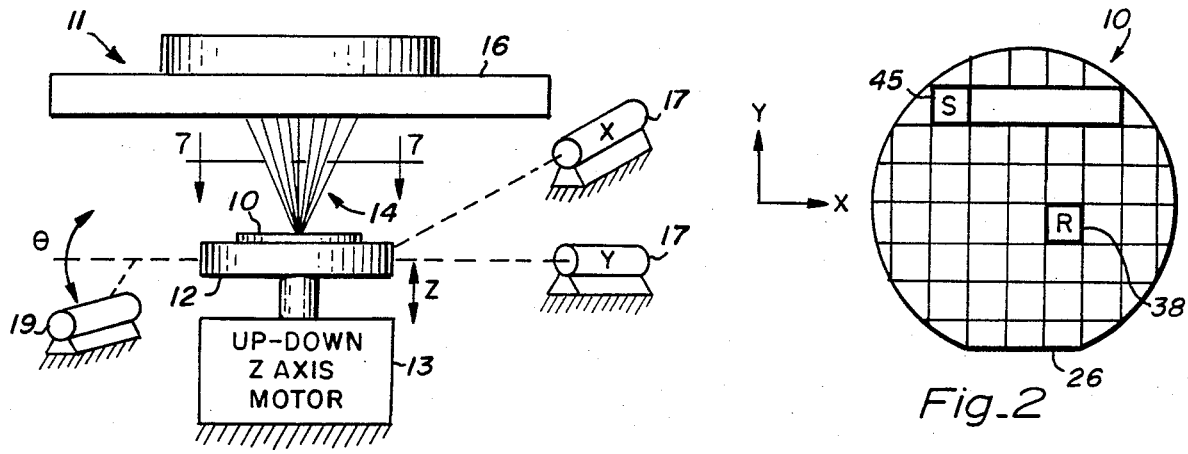
Fig_1
Fig_2
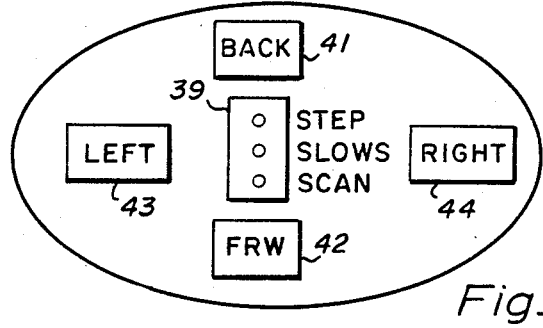
Fig_4
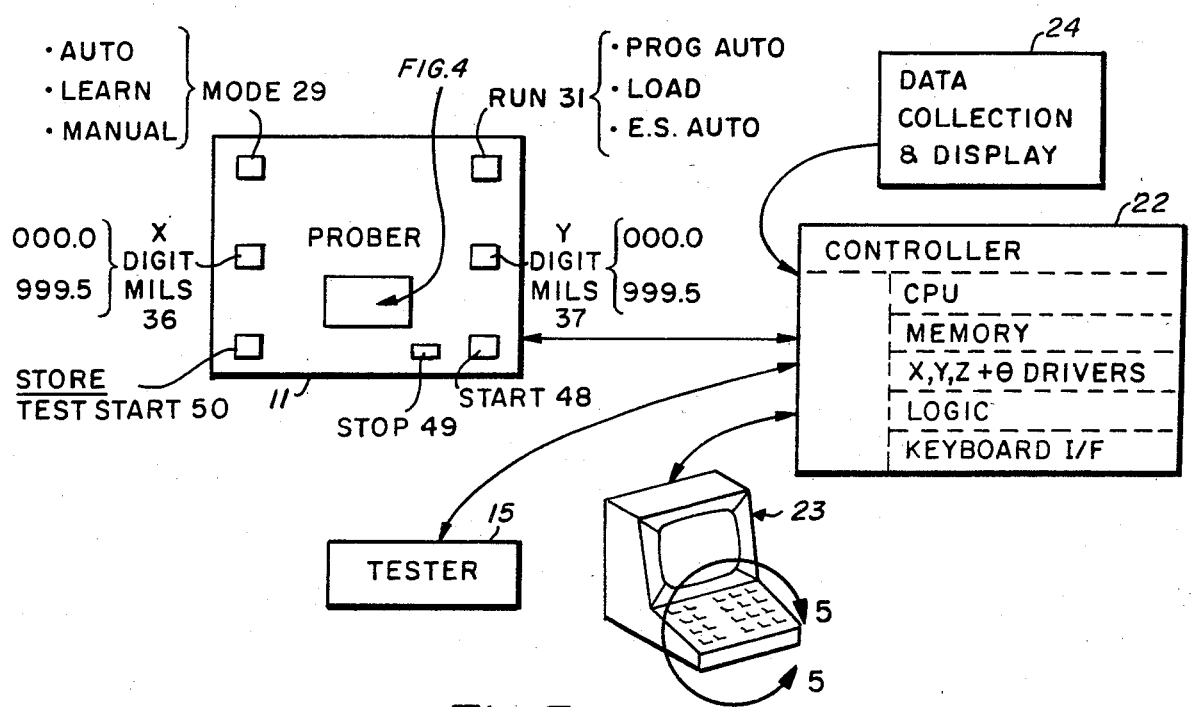
Fig_3

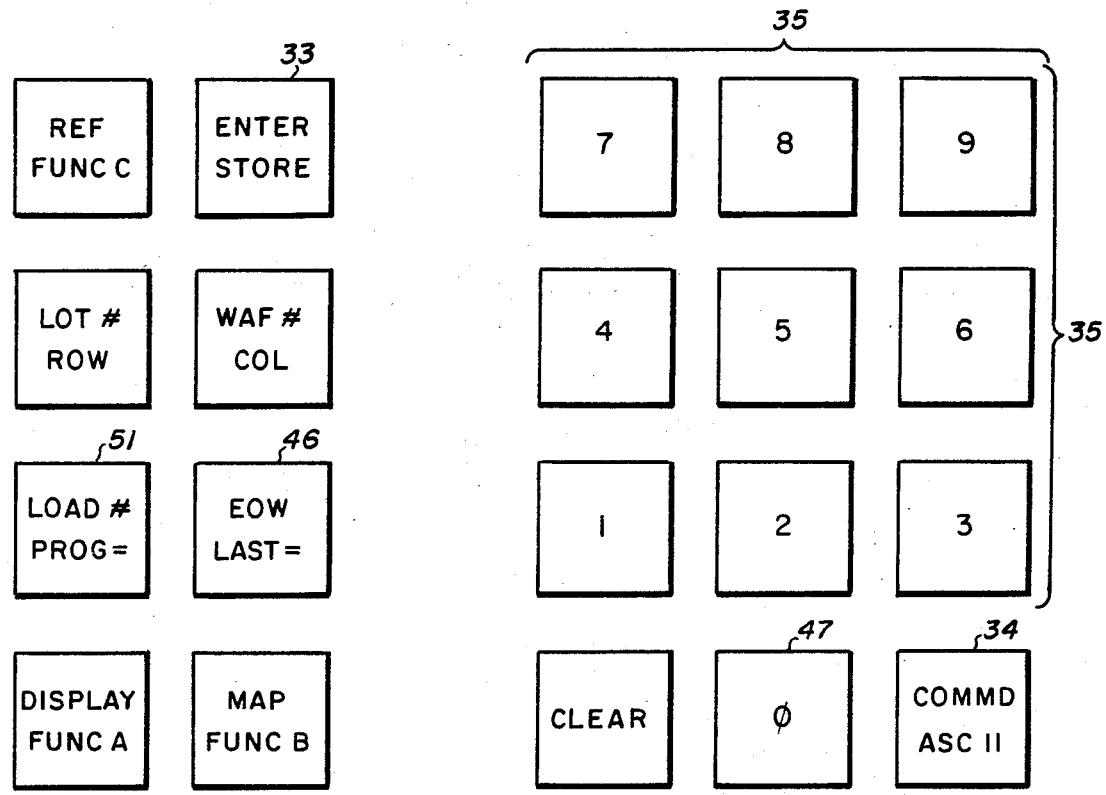
Fig_5

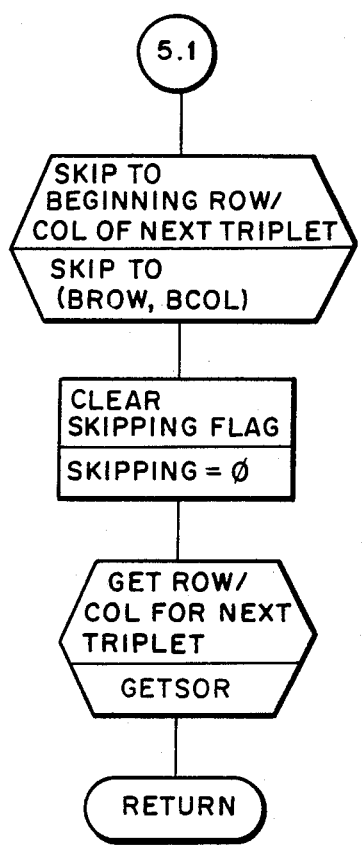
Fig_6F
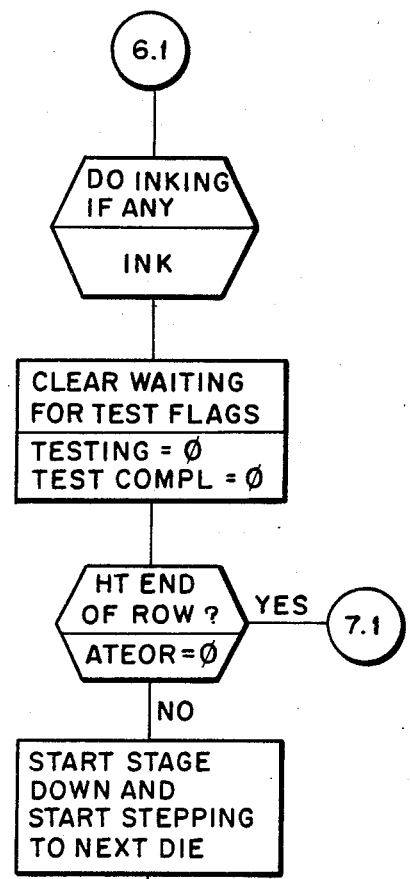
Fig_6G
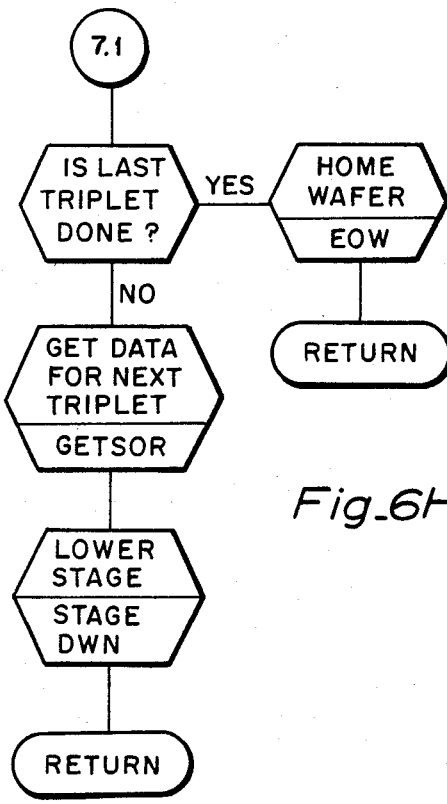
Fig_6H

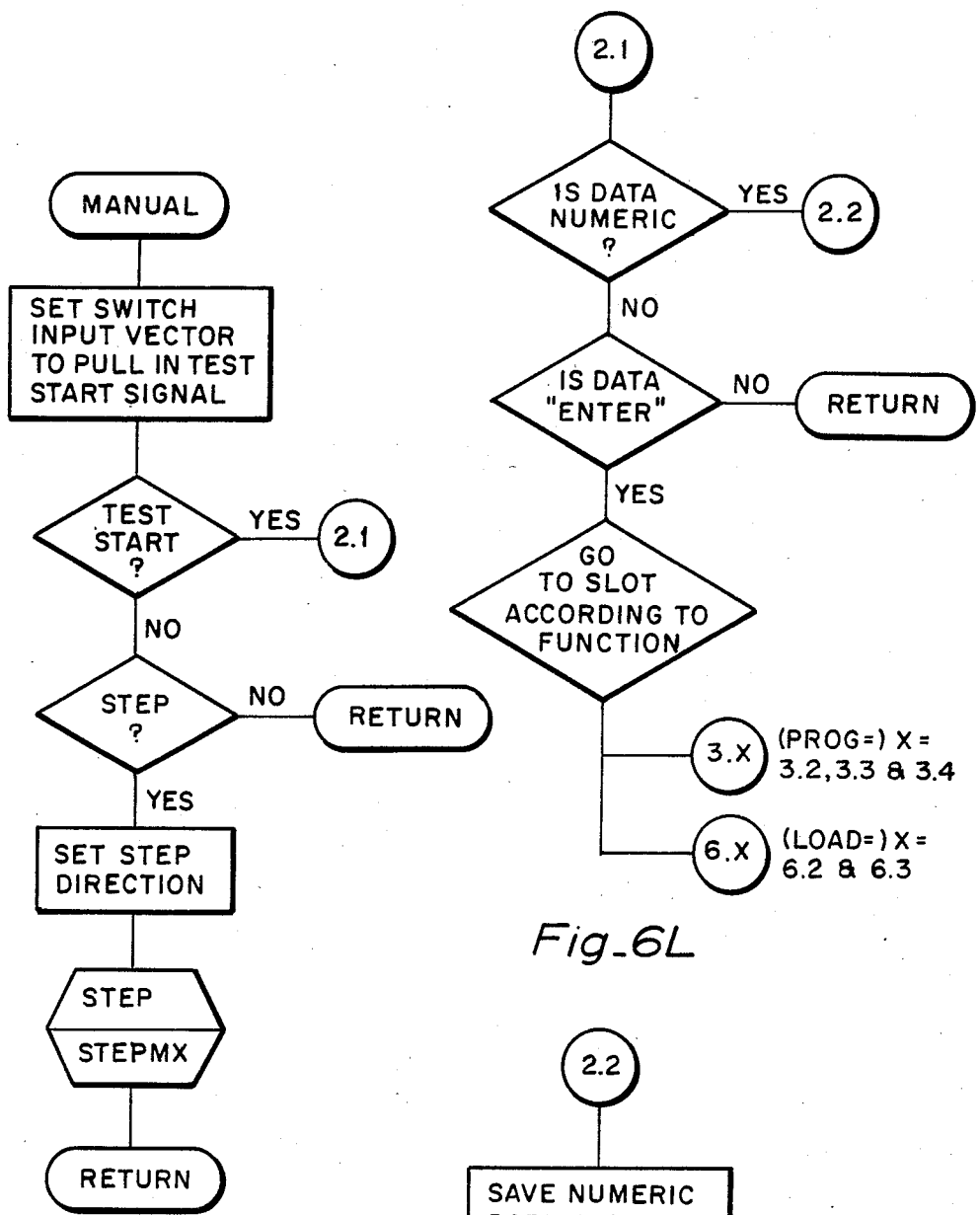
Fig_6I
Fig_6L
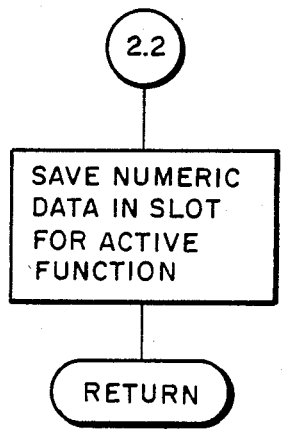
Fig_6M

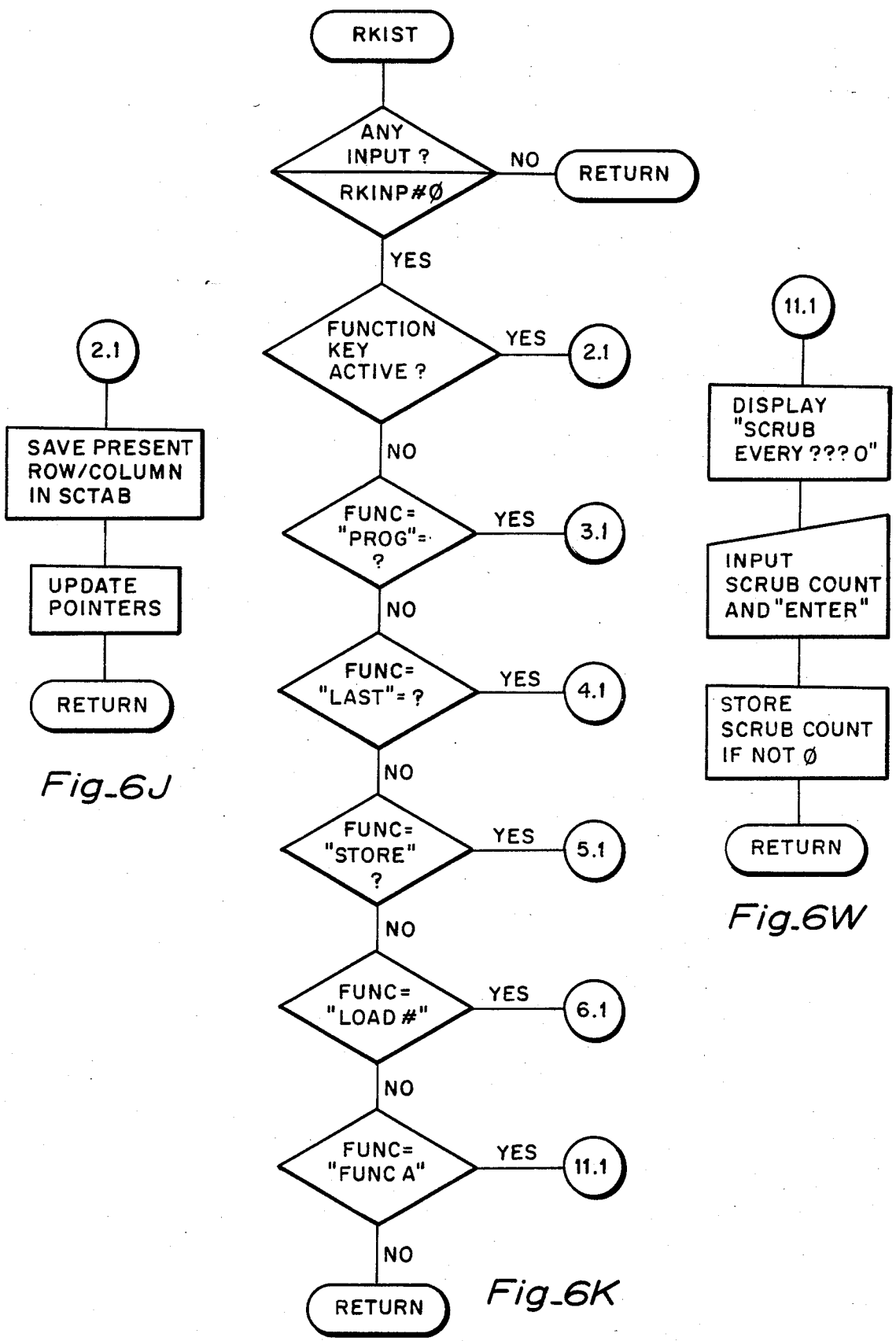

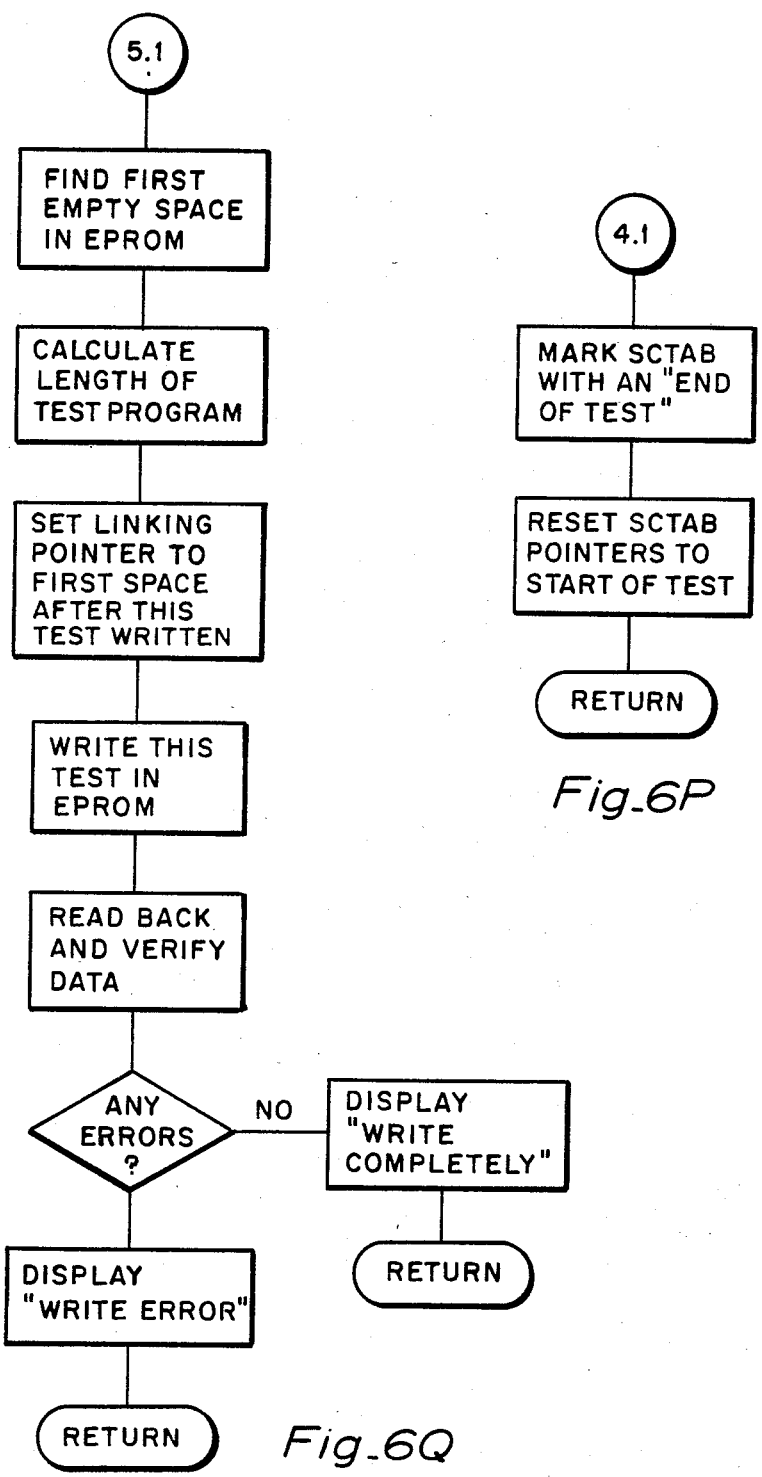

AUTOMATIC WAFER PROBER HAVING A PROBE SCRUB ROUTINE

BACKGROUND OF THE INVENTION

The present invention relates in general to automatic wafer probers and, more particularly, one including an automatic probe tip scrub routine.

DESCRIPTION OF THE PRIOR ART

Heretofore, automatic wafer probers have included a means for allowing the operator to gain access to the probe tips with an emery cloth for cleaning of the tips by hand. However, great care must be exercised by the operator so as not to bend the tips or otherwise damage the probe tips during the cleaning operation. If one of the probe tips is damaged the entire probe card, carrying as many as 20 probes, must be replaced.

SUMMARY OF THE PRESENT INVENTION

The principal object of the present invention is the provision of an improved automatic wafer prober having a probe tip cleaning routine.

In one feature of the present invention, the wafer prober automatically interrupts its probing sequence and steps the probes off of the wafer onto an abrasive element for scrubbing clean the probe tips. Thereafter, it returns to its probing sequence.

In another feature of the present invention, the abrasive element is fixedly secured to the wafer chuck and includes a flat for registration with a flat of the wafer to facilitate alignment of the wafer on the chuck.

In another feature of the present invention, the abrasive element is positioned on the wafer chuck so that the upper surface of the abrasive element is slightly below the upper surface of the wafer under test, whereby damage to the probe tips is reduced in use.

BRIEF DESCRIPTION OF THE DRAWINGS

FIG. 1 is a schematic diagram, partly in block diagram form, of a wafer prober of the type to be employed in the preferred embodiment of the present invention, FIG. 2 is a plan view of a wafer to be probed showing the position of the die on the wafer to be probed, FIG. 3 is a schematic block diagram of a prober/tester system incorporating features of the present invention, FIG. 4 is an enlarged detail view of a switch portion of the structure of FIG. 3, FIG. 5 is a plan view of the keyboard of an input/output terminal delineated by line 5—5 of FIG. 3, FIG. 6, A-W, is a logic flow diagram for a computer program employed in the prober of the present invention.

DESCRIPTION OF THE PREFERRED EMBODIMENTS

Figures 6A, 6C:
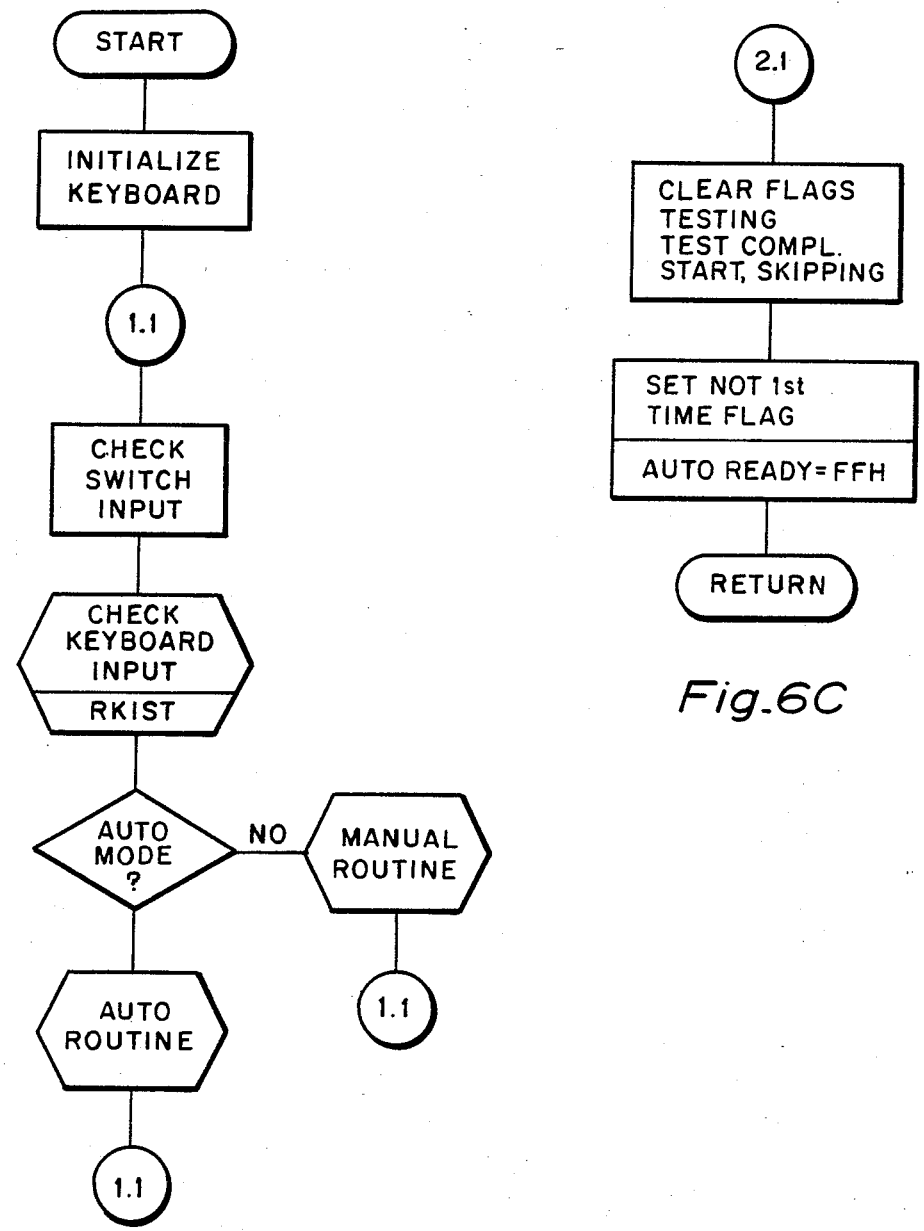
Figure 6B:
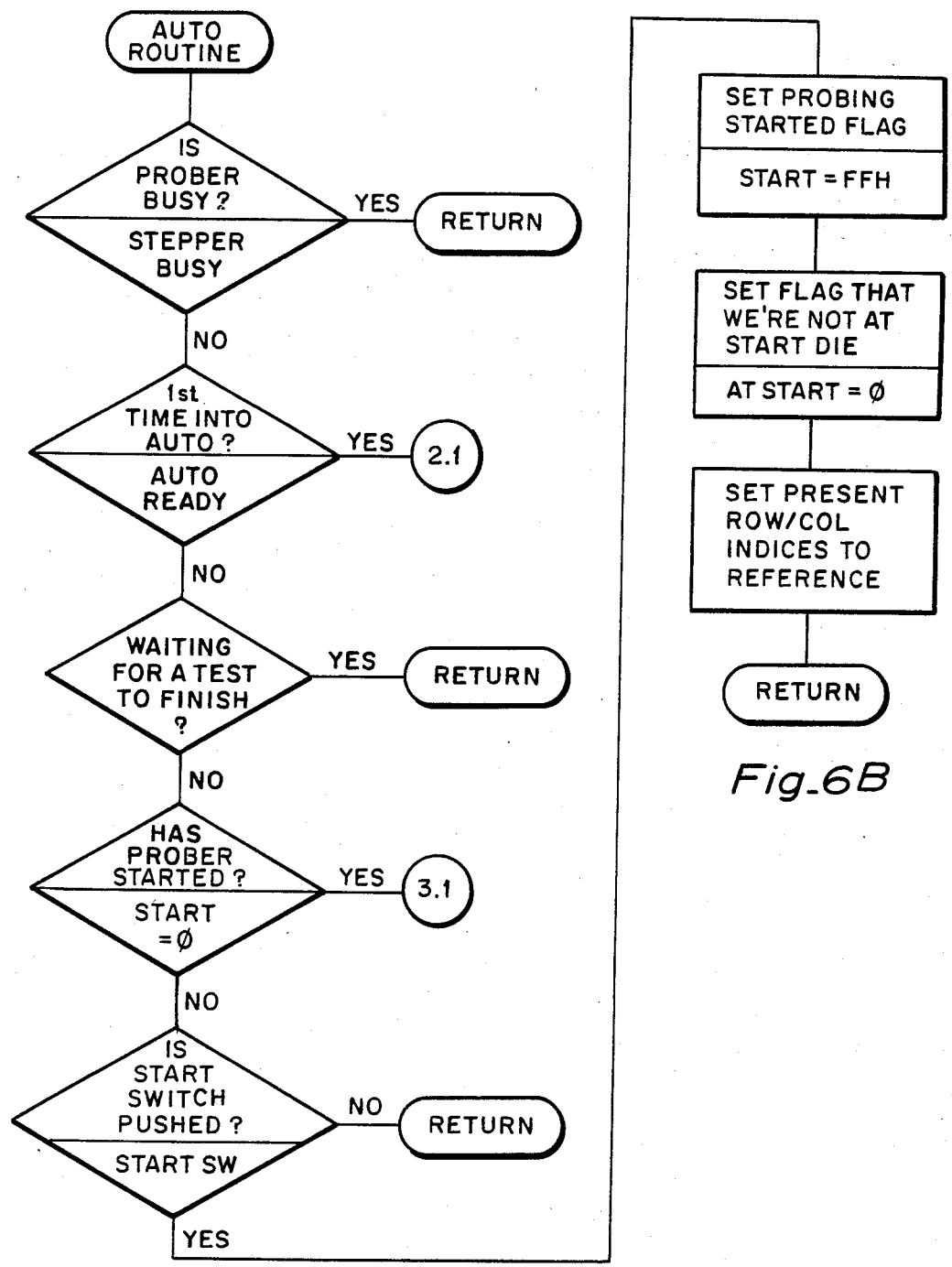
Figure 6D:
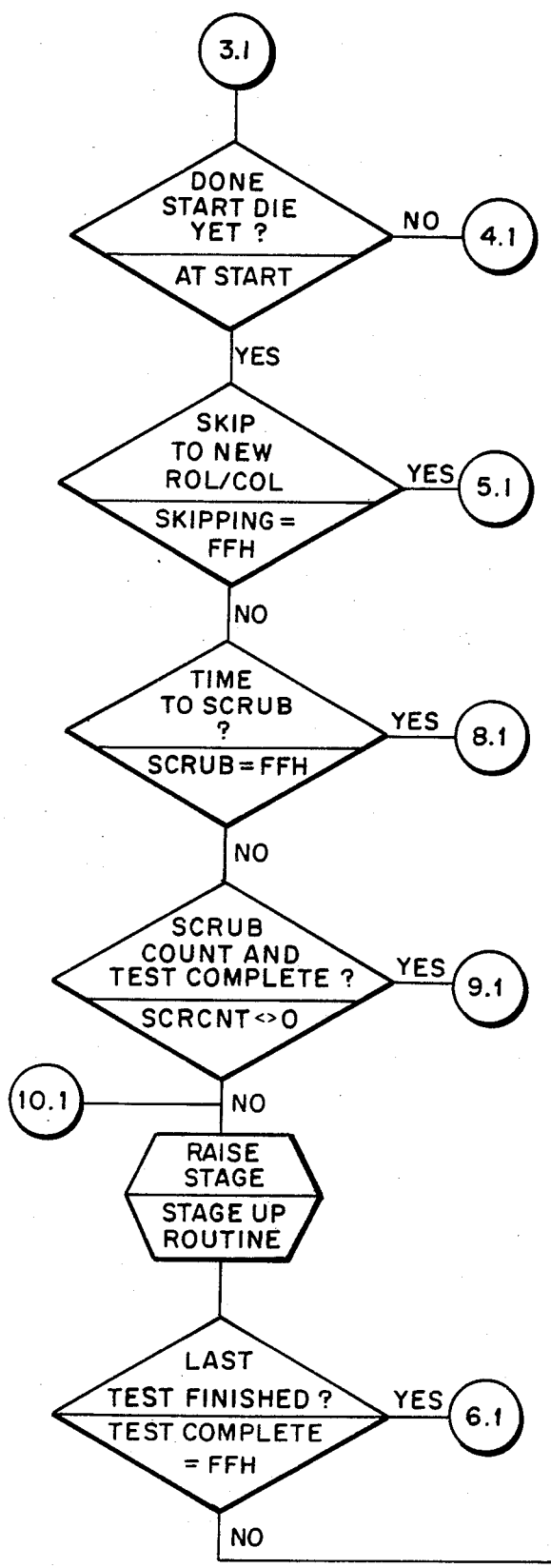
Figure 6E:
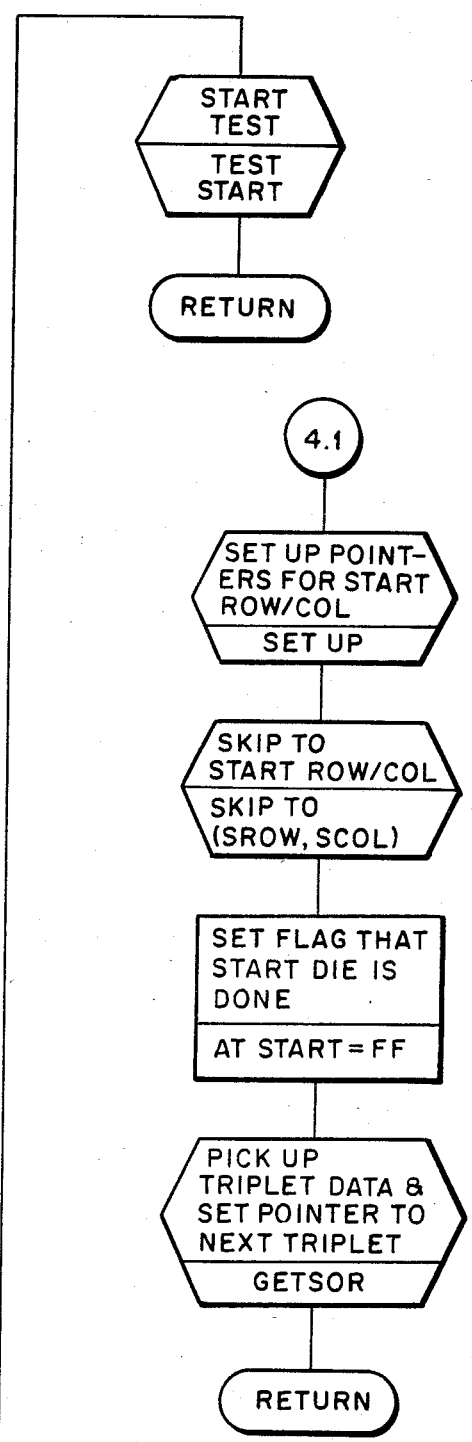
Figure 6N:
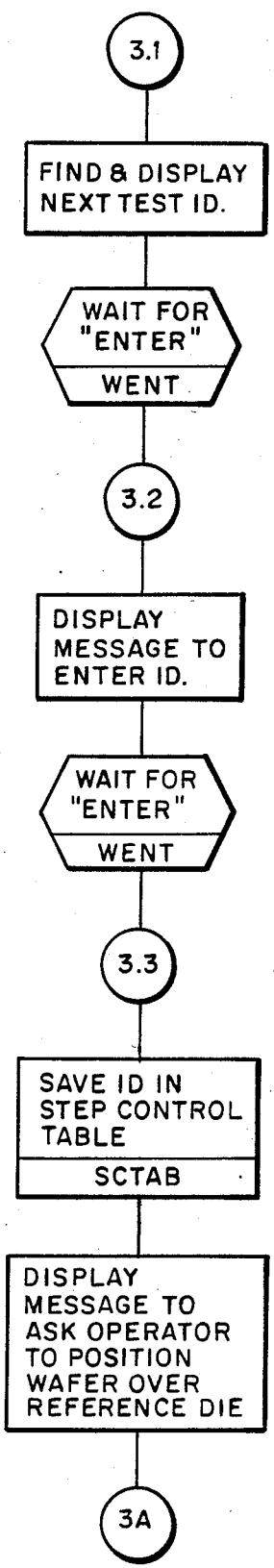
Figure 6O:
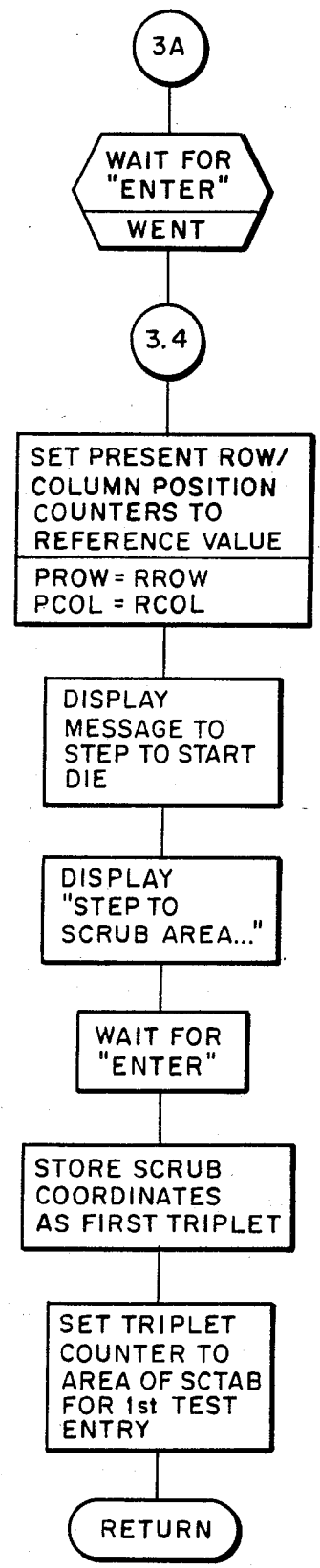
Figures 6R, 6S, 6T:
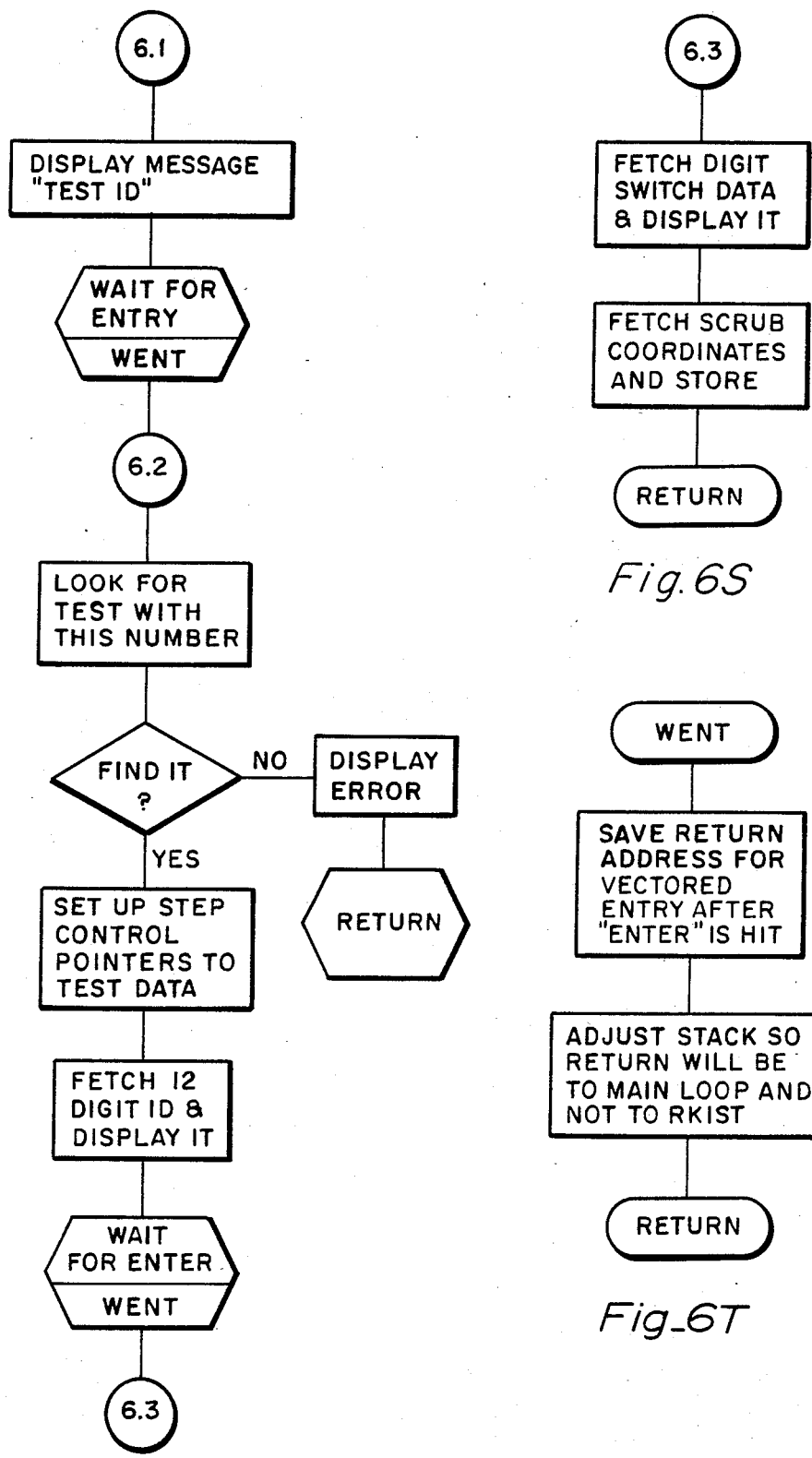
Figure 6U:
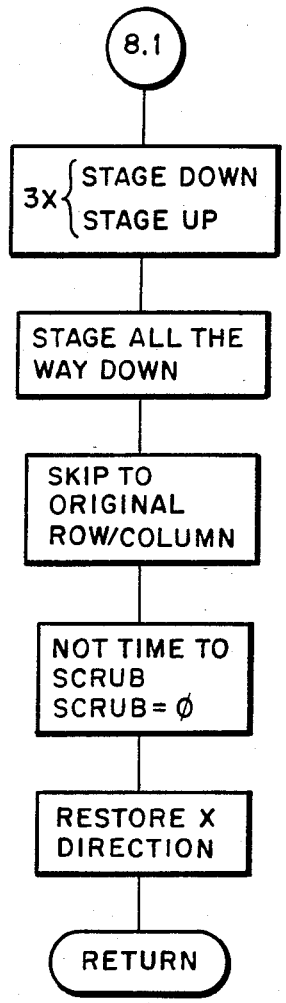
Figure 6V:
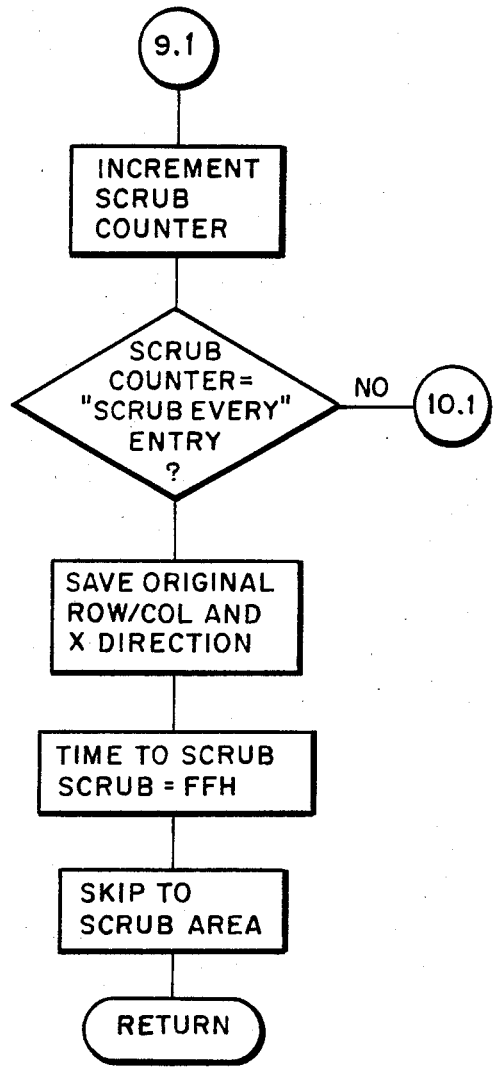

Referring now to FIGS. 1 and 3, there is shown an automatic wafer prober 11 for electronically testing discrete semiconductive devices, such as integrated circuits, light emitting diodes, etc. while still in the wafer form. Automatic wafer probers 11 are well known commercially available machines such as that described in U.S. Pat. No. 3,996,517, the disclosure of which is hereby incorporated by reference as though fully set forth hereat. They normally mark the defective electronic device or die in some manner usually with a solenoid operated inker of some variety. The marked die is later discarded or sorted for grading in accordance with the color of the ink.

The usual sequence of events is for a vacuum chuck 12, on which the wafer 10 to be tested is mounted, to be raised up in the vertical or Z axis direction under the influence of a pneumatic cylinder or solenoid 13. The individual die to be tested is electrically connected through a number of spring loaded needle like probes 14 to a die tester 15. A surface sensor, not shown, makes contact with the wafer's surface, and via digital logic circuitry provides a signal for the tester 15 to begin its test sequence. The test sequences are developed in the tester 15 which is external to the prober 11 and through electrical connections to the probes 14, on their support ring 16, it applies the test signal to the die under test and monitors the die response to the test sequence. If a defective die is found it is marked by an electrical signal being fed back to the prober 11 from the tester 15 to actuate an inking probe to mark the die accordingly. If a defective die is found it is discarded in a later processing step which cuts up the wafer and separates the numerous dies formed on its surface.

Upon completion of the test of a die, an end of test (EOT) signal is passed from the tester 15 to the prober 11 causing the vacuum chuck 12 to drop to its lower limit allowing indexing of the wafer in the X and Y direction to the next die on the wafer at which point the next test sequence is initiated. X and Y stepping motors 17 translate the chuck 12 in the row and column direction respectively, to bring the next die under the pattern of the probing needles 14. Also, the chuck 12 is rotatable around the Z axis, i.e., in the $\theta$ direction by means of a motor 19. A microscope (not shown) is disposed over the ring of probes 14 and permits the operator to observe the wafer 10 for initial alignment of the die test pattern relative to the individual probe pattern.

The prober 11 includes a controller 22 which interfaces the tester to the prober 11. The controller 22 includes a keyboard input/output terminal 23 which permits the operator to input data to and to output data from the prober 11. Also, a display and data collection system 24, which may include a printer, is interfaced to the tester 15 via the intermediary of the controller 22, such that the test results may be collected and displayed, as by wafer mapping. The controller 22 includes a central processing unit (CPU) such as a model 8080 commercially available from Intel of Santa Clara, Calif. In addition, the controller 22 includes suitable memories, X, Y, Z, and $\theta$ drive units for driving the stepping motors 17 and 19, the solenoid or pneumatic motor 13, a program or logic for controlling the various functions of the prober and tester, and a keyboard interface for interfacing the keyboard 23 to the controller and prober. A suitable prober 11 is a SP1 commercially available from Pacific Western Systems, Inc. of Mountain View, Calif. A suitable keyboard 23 is a model ADM3A commercially available from Lear Siegler of Anaheim, Calif.

Referring now to FIG. 2 there is shown a conventional semiconductive wafer 10 having rows and columns of die formed thereon and having an alignment flat 26 for registration with a flat on the chuck 12 so as to align the rows and columns of die to the chuck 12. In a given probe sequence for probing the wafer 10, it is often desirable to test only certain ones of the die as opposed to all of the die on the wafer and the prober system of the present invention is adapted for testing any arbitrary pattern of die in the column and row die matrix on the wafer 10.

Referring now to FIGS. 2–5 a method for programming an arbitrary probe step sequence in the automatic wafer prober system consisting of the prober 11, controller 22, and keyboard 23 will be described in greater detail. The prober 11 includes on its front panel a number of switches for feeding information to the controller 22 which then in connection with its central processing unit, associated memory and the logic programmed in the controller 22, processes the infromation and commands the prober to perform certain functions such as to move in the X, Y, Z and $\theta$ directions by producting a train of output drive pulses to the respective stepping drive motors, such as drive motors 17 and 19.

To program the prober/control machine with a desired probe step sequence, the operator sets a MODE switch 29 on the front panel of the prober to the LEARN position. The MODE switch has three positions, namely AUTO, LEARN, and MANUAL. The operator also sets a RUN switch 31 to PROG AUTO. Run switch 31 has three positions, namely PROG AUTO, LOAD, and E.S. AUTO. This switch setting will allow a probe step control LEARN sequence in the controller 22 to be initiated at the keyboard 23. In response to the operator hitting key COMND 34 and then key PROG=51 the program in the controller 22 will cause the display 32 on the keyboard 23 to display "NEW TEST ID=XXX".

Next, the operator hits the ENTER key 33 on the keyboard 23. The controller 22 in response, then causes the display 32 to print "ENTER 12 DIGIT IDENTIFIER...." Next, the operator enters a 12 digit alpha-numeric identifier using the ASC II feature and/or the numbers. The ASC II feature is the key 34 titled COMND ASC II. Hitting this key 34 permits non-numeric entries. If an internal flag is set indicating that such an entry is permissable and if key 34 is pressed, then the next two number keys 35 hit are considered to be a single ASC II character. Thus, by pressing the proper numerical keys 35 in accordance with a predetermined code a desired alpha-numeric identifier is entered into the memory of the controller 22.

The operator then hits the ENTER key 33. This then causes the program to display on display 32 of the keyboard 23 a predetermined reference position which is arbitrarily selected to be R=128, C=128, which means that the reference position is arbitrarily identified as row 128 and column 128 of the matrix of die to be probed.

The program acting through the central processing unit of the controller causes X and Y counters in the CPU to be reset at the reference location, namely, R128, C128. The CPU's X and Y counters monitor the X and Y coordinates of the probes 14 relative to the die in the die matrix on the wafer 10. The counters can count the individual pulses or steps made by the respective stepping motors 17 for both the X and Y directions. However, these counts would get relatively high and require a substantial amount of memory and thus the program utilized the die size data inputted to the CPU via the digital X and Y switchs 36 and 37 to divide the stepping motor pulses so as to reduce the count data to row and column data.

Next, the operator presses the ENTER key 33 and the program in the controller causes "SET X+Y DIGIT SWITCHES AND POSITION AT REFERENCE DIE ... HIT ENTER WHEN READY ..." to be displayed. The operator then follows this instruction displayed on the display 32 of the keyboard 23 by setting X and Y digit switches 36 and 37, respectively, on the front panel of the prober 11 to the X and Y dimensions, respectively, on the front panel of the prober 11 to the X and Y dimensions, respectively, in mils of the die on the wafer 10. The digit switches 36 and 37 are BCD coded rotary switches ranging from 000.0 mils to 999.5 mils each. Further following the displayed instructions, the operator then manipulates the probes relative to the wafer to set the probes 14 over the pattern of probe pads on a reference die 38 on the wafer 10.

To manipulate the probes relative to the wafer, the prober 11 includes switches on its front panel. The switches are shown in FIG. 4. More particularly, there is a toggle switch 39 having three positions, namely, STEP, SLOW SCAN, and SCAN. Above and below the toggle switch 39 are BACK and FORWARD switches 41 and 42, respectively, and to the left and right of the toggle switch 39 are LEFT and RIGHT switches 43 and 44, respectively, for causing the chuck 12 to move to the left and right relative to the probes 14.

Thus, the operator by utilizing switches 39–44, manipulates the chuck 12 relative to the pattern of probes 14 to set the probes over the reference die 38.

Next, the operator hits ENTER key 33 which gives the next instruction on the keyboard display 32 as "STEP TO START DIE AND HIT STORE ON PROBER". The operator then utilizes the switches 39–44 on the probe 11 to manipulate the probes 14 over a die on the wafer which the operator wishes to identify as the start die 45, i.e., the first die to be tested in the probe step sequence. Upon reaching the start die 45 the operator hits a STORE key 50 on the front panel of the prober 11. In traversing the matrix of die from the reference die 38 to the start die 45, the CPU of the controller 22 has been counting the row and columns steps to the start die 45 and upon pressing of the STORE key 50, those coordinates are stored in the memory of the CPU.

Next, the operator manipulates the row direction switches 43 or 44 to step the probes to the last die to be probed of any contiguous block of die to be probed on the same row from either direction, i.e., either left or right. Upon reaching the last die of that block, the operator hits the STORE key 50. This causes the CPU to store the X and Y coordinates of the end column assuming the same row.

Next, the operator by use of the manipulative switches 41–44 steps the probes to the next die to be tested and hits STORE key 50, the operator then steps to the last die of any contiguous block on the same row from either direction left or right and again hits the STORE key 50. This stores the X and Y coordinates of the first and last die of the contiguous block to be tested in that row. These latter steps are then repeated for all of the remaining die to be tested on the wafer 10. Upon completion of stepping through the probe step sequence the operator hits the COMND key 34 followed by pressing the LAST key 46. This files the coordinates for the probe step sequence in the random access memory of the controller 22.

The operator can try out the probe step sequence he has just programmed by positioning the probes to the reference die 38 and hitting the LOAD key 51 on the keyboard 23 followed by hitting the ZERO key 47 three times and then hitting the ENTER key 33. The CPU then pulls out the 12 digit identifier and displays that on the display 32 of the keyboard 23. The operator may then hit the ENTER key 33 again which will then cause the CPU to display the digit switch settings 36 and 37, respectivley. The operator then goes back to the prober 11 and switches the three position MODE switch 29 to AUTO and the three position RUN switch 31 to PROG AUTO and hits a START button 48 on the prober. This initiates the probe step sequence previously filed in the random access memory of the controller 22.

In order that the operator can observe the sequence in relatively slow motion, the operator holds a STOP button 49 depressed on the front panel of the prober 11 which causes the motion of the prober to stop after reaching each successive die in the probe step sequence. After the probes have stopped, the operator merely presses the START button 48 and the prober will go to the next die in the sequence.

If the operator is satisfied with the probe step sequence, the operator saves the program by positioning the MODE switch 29 in the AUTO position and the RUN switch 31 in LOAD position and then on the keyboard 23 hits the COMND key followed by hitting the STORE key 33 which then enters the program previously stored in the random access memory of the CPU into an electrical programmable read only memory (EPROM) portion of the memory of the CPU. While the data is being transferred from the random access memory to the read only memory, the keyboard display 32 displays "WRITING EPROMS". The CPU checks the data from the RAM with the data written into the EPROM for errors. If it finds no errors it displays on the display 32 of the keyboard 23 "WRITE COMPLETED".

Once written into the read only memory of the controller 22, that particular probe step sequence can be recalled for testing a batch of wafers by entering the proper 3 digit test identifier and calling up the program.

Figure 7:
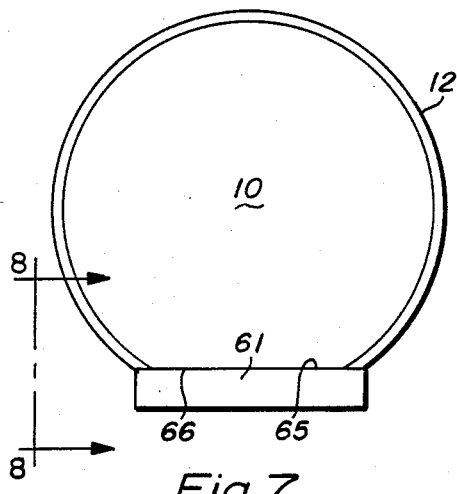
FIG. 7 is a plan view of a wafer and wafer chuck taken along line 7—7 of FIG. 1.
Figure 8:
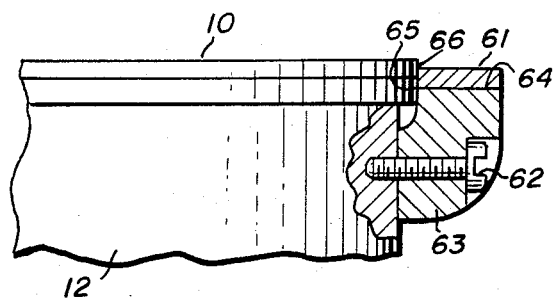
FIG. 8 is an enlarged sectional view of a portion of the structure of FIG. 7 taken along line 8—8 and being partially broken away to show the fastener.

Referring now to FIGS. 7 and 8 there is shown the wafer chuck 12 with the wafer 10 in aligned position thereon. A scrub block 61 of an abrasive material, such as ceramic, is fixedly secured as by a screw 62 and holder member 63 to the side of the chuck 12. The scrub block is affixed to the holder member 63, as of brass, via an adhesive cement at 64. The scrub block 61 includes a flat 65 facing the chuck 12 for registration with a flat 66 of the wafer for alignment of the wafer 10 on the chuck 12.

After the start of the probing sequence of die on the wafer 10, the prober system counts the number of die probed. When the number of probed die equals the preselected number before scrub, the probe sequence is automatically interrupted by the prober system and the probes are stepped off of the wafer 10 onto the upper scrubbing surface of the scrub block 61. The upper surface of the scrub block 61 is preferably positioned slightly below or even with the upper surface of the wafer 10 being probed. Once stepped onto the scrub block 61, the probe tips are stepped down (actually the wafer and chuck are stepped up) onto the scrub block 61 a few times, i.e., one to three times, for abrading oxide and other foreign matter from the probe tips. The stepping action on the scrub block 61 is essentially the same as the stepping action on the die being probed. As the probe tips are stepped down on the scrub block 61, they deflect along the scrubbing surface of the scrub block 61, thereby producing a scrubbing or rubbing action which cleans the probe tips without damaging the tips.

Once the scrubbing steps are completed the prober causes the probes to return to the interrupted probe sequence.

The operator enters the information for the scrub routine into the prober system by pressing the ENTER key 33 on keyboard 23 and the program in the controller 22 causes the CRT to display, "STEP TO SCRUB AREA ... HIT ENTER WHEN READY". The operator manipulates the stepping switches 41-44 to step the prober over the scrub block 61. Then the operator presses the ENTER key 33.

Next the operator presses the COMND key 34 together with a FUNC A key 67 and the CRT display displays "SCRUB EVERY 0000". The operator then presses the numerical keys until the desired number is displayed where the "0000" had been displayed. Any even number of 10 between 10 and 2500 can be set by the operator and this is the number of die to be probed before the probing sequence is interrupted for performance of the scrub routine for cleaning of the probe tips. Next the operator presses the ENTER key 33 and the display displays "ENTERED". The scrub routine information is now entered and the operator merely presses the START key to start the automatic probing sequence, which is periodically interrupted by the scrub routine.

The advantage to the method and apparatus of the present invention is that the probe tips are cleaned automatically and in a manner so as not to damage the probe tips. In addition, the number of die to be probed before scrubbing of the probe tips is readily selected in accordance with the expected rate at which the probe tips will be fouled when probing the particular die under test. The flow chart for the program for programming the probe step sequence is shown in FIG. 6 and the listing for the program is disclosed in Appendix I, below.

```
  25      1          DCL
                     ACK           LIT '6',
                     CLEAR         LIT '0',
                     CRT           LIT 'C',
                     ECHO          LIT '2',
                     ENQ           LIT '5',
                     ECT           LIT '4',
                     ENTERSPROG          LIT '2',
                     ERR           LIT '1',
                     ESC           LIT '1BH',
                     FALSE         LIT 'C',
```

```
                    MSSTOPSCODE         LIT '2',
                    NAK                 LIT '15H',
                    PROGSAUTO           LIT '3',
                    RUB                 LIT '10H',
                    THETASONSCODE       LIT '4',
                    TRUE                LIT 'OFFH',
                    TSTRT               LIT '20H',
                    /*********I/O ASSIGNMENTS***********/
                    /**********OUTPUT PORTS************/

/*::::::::::::::::MANUAL ROUTINE::::::::::::::::*/
998    1      MANUAL: PROC ;

101C   2          IF STOPSSW THEN STOPFLG=TRUE;
                  SWOUT=STAGESUPSDWNSADD;
1013   2          INPUTSBUF=SWIN;

1016   3              INPUTSBUF=SHL (INPUTSBUF,1);

1023   3              INPUTBUF=SHL(INPUTBUF,2);
1024   3              IF CARRY THEN
1025   3                 DO;
1046   8                              CALL SCENT;
1047   8                              RETURN;

1055   4                 END;

1106   2              IF (FORWARD OR BACK) AND
                          (YTOG+1=YSDIRECTION) THEN
111C   4                           CALL STEPMY;

1188   3                 END;

1240   2              IF (RIGHT OR LEFT) AND
                          (XTOG+1=XSDIRECTION) THEN
                                   CALL STEPMX;
1245   4

1356   1      AUTOSROUTINE: PROC ;

1370   2          IF STEPPERSBUSY THEN RETURN;
1418   3          IF NOT AUTOREADY THEN
1419   3             DO;
1420   4                SCANSFLAG=FALSE;
1421   4                START=FALSE;
1422   4                TESTING=FALSE;
1423   4                ROWEND=FALSE;
1424   4                TESTSCOMPL=FALSE;
1425   4                SKIPPING=FALSE;
1441   4                RETURN;
1541   2          IF START THEN
1542   2             DO; PROC PUBLIC;
                        IF MODEA=PROGSAUTO THEN
                        DO;
                           IF NOT ATSSTART THEN
                           DO;
                              IF SCPTR=0 THEN
                              DO;
                                 START=FALSE;
                                 CALL RESRTA(.NOTID);
                                 RETFLG=TRUE;
                                 RETURN;
                              END;
                              CALL SETUP; /* SETS UP REF R/C & DIGITS */
                              CALL SKIPSTO(SROW,SCOL);
                              ATSSTART=TRUE; /* READY TO GO */
                              IF GETSOR THEN EDGESCNTR=0; /* RESET */
                              RUNNING=TRUE;
                              RETFLG=TRUE; /* TO RETURN FROM CALLER*/
                              RETURN;
                           END;
                           IF SKIPPING THEN  /* IF NOT NEXT DIE ON ROW*/
                           DO;
```

```
76   4              CALL SKIP$TO(BROW,BCOL); /* SKIP TO NEXT DIE */
77   4              SKIPPING=FALSE;         /* RESET */
78   4              SCPTR=SCPTR-3;          /* NEXT TRIPLET */
79   4              IF GETSOR THEN EOW$CNTR=0; /* RESET */
80   4              RETFLG=TRUE;
81   4              RETURN;
82   4            END;
83   4          END;
84   3        ELSE RUNNING=TRUE;  /* REGULAR AUTO */
85   2        IF SCRUB THEN
86   2          DO;
87   2            DO I=1 TO 3;
88   3              CALL STAGEDWN;
89   4              CALL STAGEUPROUTINE;
90   4            END;
91   4          MSTOPOUT=2;
92   3          CALL TIME(10);
93   3          MSTOPOUT=0;
94   3          CALL STAGEDWN;
95   3          SCRUB=FALSE;
96   3          SCRCNT=0;
97   3          CALL SKIPTO(XROW,XCOL);
98   3          XTOG=STOGX;
99   3          RETFLG=TRUE;
100  3          RETURN;
101  3        END;
102  3        IF (CLCNT<>0) AND NOT TESTING THEN
103  2          DO;
104  2            CNT20=CNT20-1;
105  3            IF CNT20=0 THEN
106  3              DO;
107  3                CNT20=10;
108  4                SCRCNT=SCRCNT+1;
109  4                IF SCRCNT>=CLCNT THEN
110  4                  DO;
111  4                    XROW=PROW;
112  5                    XCOL=PCOL;
113  5                    STOGX=XTOG;
114  5                    MSTOPOUT=2;
115  5                    CALL TIME(10);
116  5                    MSTOPOUT=0;
117  5                    STAGEUP=TRUE;
118  5                    CALL SKIPTO(CROW,CCOL);
119  5                    SCRUB=TRUE;
120  5                    RETFLG=TRUE;
121  5                    RETURN;
122  5                  END;
123  5          CALL STAGE$UP$ROUTINE;
1566 3          IF NOT STAGEUP THEN RETURN;
1567 3        END;
1569 3      ELSE
         DO;
1570 2        IF START$SW THEN
1571 3          DO;
1572 3            START=TRUE;
1576 4            AUTOREADY=TRUE;

44   1    NAUTOSTART: PROC PUBLIC;
52   3                CNT20=10;

1615 5              IF TEST$COMPL THEN
1616 5                DO;
1617 6                  CALL INK;

1635 6                  TESTING=FALSE;
1636 6                  TESTCOMPL=FALSE;

1648 7                    IF AT$EOR THEN
1649 7                      DO;

657  9                        SKIPPING=TRUE;
658  9                        IF GETSOR=0 THEN CALL EOW;
660  9                        CALL STAGEDWN;

1661 9                        RETURN;

1664 8                      END;

1674 6                END;

1677 6                CALL TEST$START;

1680 6                RETURN;
```

```
1780    1       CALL RKINIT;

1793    1       DO WHILE TRUE;
1806    2         SWOUT=MANAUTO;
1807    2         MODEM=SWIN AND 90H;
1808    2         SWOUT=ESAUTOADD;
1809    2         MODEM=ROR((MODEM OR (ROR(SWIN,1) AND 60H)),4);

1815    2         CALL RKIST;

1860    2         IF AUTO THEN CALL AUTO$ROUTINE;
1862    2         ELSE CALL MANUAL;
1863    2       END;

5  ;/////////PUBLIC REFERENCES///////////////////
            6  PUBLIC PID,RKIST,PROW,PCOL,RKINIT,SCENT
            7  PUBLIC RROW,RCOL,RKERTM,RKFLG,SCPTR,BCDCON
            8  PUBLIC GETSOR,ATEOR,BCOL,BROW,SROW,SCOL
            9  PUBLIC SETUP,DECR,RKRCU,GODO,SCTID
           10  PUBLIC CRTAB,RS1IN,RS1OUT,RS2IN,RS2OUT
           11  PUBLIC CROW,CCOL,CLCNT,DELAM,FLIPF
           12  ;/////////////////////////////////////////////
           13          EXTRN MODEM,VACLIT,EOW,METRIC,XTOG,BCDTA
                       B
           14  ;         PROBE 2 REMOTE KEYBOARD 1
           15  ;-----------------CONSTANTS------------------
           16  ;
8000       17  HRAM     EQU     08000H    ;1ST LOC. UPPER RAM
8000       18  RAM      EQU     8000H     ; LOWEST RAM LOCATION
           19  ;
           20  ; OUPUT PORT ASSIGNMENT
           21  ;
0021       22  RPDA     EQU     33        ; OPR. REMOTE PANEL DATA
                   OUT
0020       23  RPDS     EQU     32        ; OPR. REMOTE PANEL DISP
                   LAY CNTRL.
0008       24  LIGHT    EQU 11            ;LIGHT VACUUM PORT
           25  ;
           26  ; INPUT PORT ASSIGNMENT
           27  ;
0020       28  IRPDA    EQU     32        ; OPER. REMOTE PANEL DAT
                   A IN
           29  ;
           30  ;                          MEMORY ASSIGNMENT
           31  ;
           32  ; ****************STORAGE FOR VARIABLES & FLAGS*
                   ************
           33  ;
           34  ;
           35          ASEG
0003       36          ORG 3
           37  ;******** C O N F I G U R A T I O N   D A T A **
                   *************************
0003 01    38  PROML:  DB 1
0004 02    39  CONFIG: DB 2
0005 390A  C 40  ENDL:   DW EOP
           41
           42  ;******** I N T E R R U P T   V E C T O R *****
                   *********************
0038       43          ORG 38H
0038 CD2805 C 44         CALL RKINT
003B F8    45          EI
003C C9    46          RET
           47
8000       48          ORG 08000H
           49  ;
8000       50  RS1IN:  DS 256    ;RS232 PORT 2 INPUT BUFFER
8100       51  RS1OUT: DS 256    ;RS232 PORT 2 OUTPUT BUFFER
8200       52  RS2IN:  DS 256    ;RS232 PORT 3 INPUT BUFFER
```

```
B300            53 RS2OUT: DS 256     ;RS232 PORT 3 OUTPUT BUFFER
B400            54 CRTAB:  DS 72      ;CRT I/O TABLE
                55 ;
B448            56 RKDB:   DS 16      ;DISPLAY BUFFER
B458            57 RKINP:  DS 1       ;REMKB INPUT DATA
B459            58 RKFLG:  DS 1       ;FLAG WORD FOR REMKB:
                59                    ;0=AUTO MODE
                60                    ;1=COMMAND PENDING
                61                    ;3=EOW
                62                    ;4=ROTATE MODE
                63                    ;5=DASH MODE
                64                    ;6=ASCII INPUT MODE
                65                    ;7=AT START DIE
B45A            66 RKBCT:  DS 1       ;ROTATE COUNTER
B45B            67 RKMSV:  DS 2       ;LONG MESSAGE POSITION MARKER
B45D            68 RKRPSV: DS 2       ;START OF LONG MESSAGE
B45F            69 RKDCT:  DS 1       ;DASH COUNT
B460            70 RKWAIT: DS 1       ;VARIABLE WAIT COUNT
B461            71 RKAF:   DS 1       ;ASCII FLAG
B462            72 RKSAV:  DS 3       ;ASCII CONVERSION BUFFER
B465            73 LSTENT: DS 1       ;0 IF "LAST=" NOT ENTERED
B466            74 IOBYT:  DS 1       ;CONFIGURATION FLAG
B467            75 RROW:   DS 1       ;REFERENCE ROW
B468            76 RCOL:   DS 1       ;REFERENCE COL
B469            77 PROW:   DS 1       ;PRESENT ROW
B46A            78 PCOL:   DS 1       ;PRESENT COL
B46B            79 SROW:   DS 1       ;START ROW
B46C            80 SCOL:   DS 1       ;START COLUMN
B46D            81 BCOL:   DS 1       ;SC MODE COLUMN
B46E            82 BROW:   DS 1       ;SC MODE ROW
B46F            83 EORX:   DS 1       ;END OR SC MODE ROW
B470            84 CROW:   DS 1       ;SCRUB ROW
B471            85 CCOL:   DS 1       ;SCRUB COLUMN
B472            86 CLCNT:  DS 1       ;SCRUB COUNT
B473            87 WAFNO:  DS 1       ;WAFER NUMBER
B474            88 SCTID:  DS 1       ;STEP CONTROL IDENT.
B475            89 SKRUD:  DS 1       ;PROM WRITE ERROR FLAG
B476            90 PID:    DS 2       ;PROBER RS232 IDENTIFIER
B478            91 SCSPT:  DS 2       ;SC TEST START POINTER
B47A            92 SCPTR:  DS 2       ;SC CURRENT POINTER
B47C            93 DELAM:  DS 2       ;KB CONTROLLED DELAY AMOUNT
B47E            94 NOADR:  DS 2       ;ADDRESS FOR NUMERIC INPUTS
B480            95 CHKADD: DS 2       ;NEXT SLOT ADDR FOR BAD EPROM WRITE
B482            96 ENADR:  DS 2       ;ADDRESS FOR ENTER VECTORS
B484            97 ASFL:   DS 1       ;ASCII FLAG
B485            98 FLIPF:  DS 1       ;FLIP FLOP FOR LIGHTS
B486           100 RAMER:  DS 0C000H-$        ;RAM FOR CREATING TESTS
4B7A           101 RAMEND  EQU -RAMER        ;USED TO CALCULATE TEST LENGTH
               102 ;
C008           103 SCTAB   EQU 0C008H        ;BASE ADDRESS OF EPROM
0007           104 WREP    EQU 7             ;WRITE ENABLE PORT
000A           105 INSEL   EQU 0AH           ;SELECT SWITCH OUTPUT PORT
0004           106 INLIN   EQU 4             ;SWITCH INPUT PORT
               107 ;
0005           108 ESA     EQU   5           ;ES AUTO MODE
0003           109 PRA     EQU 3             ;PROG AUTO MODE
               110 ;
               111 ;
               112         STKLN 12H
               113 ;****************** START OF CODE *********************
               114 ;
               115 ;*********** CRT VECTOR ROUTINE FROM PLM CODE ***************
```

```
                    116 ;
                    117         CSEG
0000 C5             118 GODO:   PUSH B          ;CALLED BY CRT VECTOR ROUTINE WITH
0001 C9             119         RET             ;ADDRESS IN THE BC REGISTERS.
                    120 ;*********************************************
                    121 ;********* I N I T I A L I Z A T I O N   R O U T I N E **********
                    122 ;
0002 D1             123 RKINIT: POP D           ;SAVE RETURN ADDRESS BEFORE CLEARING RAM
0003 310081         124         LXI SP,08100H   ;CHANGE STACK TO UPPER RAM
0006 210080         125         LXI H,RAM
0009 CD4F00   C     126         CALL CLRAM      ;GO CLEAR LOW RAM
000C 310082         127         LXI SP,8200H    ;STACK BACK TO LOW RAM
000F 210080         128         LXI H,HRAM
0012 D5             129         PUSH D
0013 CD4F00   C     130         CALL CLRAM      ;GO CLEAR HIGH RAM
0016 3E20           131         MVI A,20H
0019 3260B4         132         STA RKWAIT
001B 3E30           133         MVI A,30H
001D 3262B4         134         STA RKSAV       ;INITIALIZE ASCII CONVERSION BYTE
                    135 ;******* CLEAR DISPLAY OF ANY CURSOR CHARACTERS ***********
0020 3EFC           136         MVI A,0FCH      ;SET ADDRESS LINES
0022 D320           137         OUT RPDS
0024 AF             138         XRA A
0025 D321           139         OUT RPDA        ; CLEAR EACH CHARACTER IN MODULE
0027 3E40           140         MVI A,40H
0029 D320           141         OUT RPDS        ; SET ALL 4 CHIPS LOW
002B 3E00           142         MVI A,0
002D D320           143         OUT RPDS        ; CLOCK WRITE PULSE
002F 3EBC           144         MVI A,0BCH
0031 D320           145         OUT RPDS        ;CHIP ENABLE OFF
0033 3EFC           146         MVI A,0FCH
0035 D320           147         OUT RPDS        ; WRITE OFF
0037 3E80           148         MVI A,80H
0039 3268B4         149         STA RCOL
003C 3267B4         150         STA RROW
003F 21FF08   C     151         LXI H,RKIM
0042 CD8102   C     152         CALL RKERM
0045 21FD01   C     153 RKCLR:  LXI H,RKOVER
0048 227EB4         154         SHLD NOADR
004B 2282B4         155         SHLD ENADR      ;DEFAULT ADRESSES FOR VECTORS
004E C9             156         RET
004F 0605           157 CLRAM:  MVI B,5
0051 0E00           158         MVI C,0
0053 70             159 LOOPO:  MOV M,B
0054 7E             160         MOV A,M
0055 B8             161         CMP B
0056 C0             162         RNZ
0057 71             163         MOV M,C
0058 23             164         INX H
0059 C35300   C     165         JMP LOOPO
                    166 ;
                    167 ;*************** L E A R N   M O D E   E N T R Y ********************
                    168
005C 3A85B4         169 SCENT:  LDA FLIPF
005F B7             170         ORA A
0060 2A7AB4         171         LHLD SCPTR
0063 3A6AB4         172         LDA PCOL
0066 77             173         MOV M,A
0067 C28100   C     174         JNZ FLIP
006A 23             175         INX H
```

```
006B 3A6934         176          LDA  PROW
006E 77             177          MOV  M,A
006F 23             178          INX  H
0070 227AB4         179          SHLD SCPTR
0073 3A0000    E    180          LDA  VACLIT        ;LIGHT ON
0076 F601           181          ORI  1
0078 3285B4         182          STA  FLIPF
007B 320000    E    183 FLUP:    STA  VACLIT
007E D30B           184          OUT  LIGHT
0080 C9             185          RET
0081 23             186 FLIP:    INX  H
0082 227AB4         187          SHLD SCPTR
0085 AF             188 FLOP:    XRA  A
0086 3285B4         189          STA  FLIPF
0089 3A0000    E    190          LDA  VACLIT
008C E6FE           191          ANI  0FEH
008E C37800    C    192          JMP  FLUP          ;LIGHTS OFF
                    194 ;*************** D E L A Y   O N E   M S E C **
                        **************************
                    195
0091 3E0A           196 DELAY:   MVI  A,10
0093 060C           197 DEL1:    MVI  B,12
0095 05             198 DEL2:    DCR  B
0096 C29500    C    199          JNZ  DEL2
0099 3D             200          DCR  A
009A C29300    C    201          JNZ  DEL1
009D 15             202          DCR  D
009E C29100    C    203          JNZ  DELAY
00A1 C9             204          RET
                    205 ;*************** END OF ROW CHECK DURING PROGRAM
                        AUTO *****************
                    206
00A2 3A6AB4         207 ATEOR:   LDA  PCOL
00A5 216F34         208          LXI  H,EORX
00A8 BE             209          CMP  M
00A9 3E00           210          MVI  A,0
00AB C0             211          RNZ                ;RETURN 0 IF NOT AT EOR
00AC 3C             212          INR  A
00AD C9             213          RET
                    214
                    215 ;************ G E T   S T A R T   O F   R O W ***
                        ***********************
                    216
00AE 0E03           217 GETSOR:  MVI  C,3
00B0 116D84         218          LXI  D,BCOL
00B3 2A7AB4         219          LHLD SCPTR
00B6 46             220          MOV  B,M
00B7 7E             221 GETBAK:  MOV  A,M
00B8 12             222          STAX D
00B9 23             223          INX  H
00BA 13             224          INX  D
00BB 0D             225          DCR  C
00BC C2B700    C    226          JNZ  GETBAK
00BF 227AB4         227          SHLD SCPTR
00C2 B8             228          CMP  B
00C3 D2CD00    C    229          JNC  XDTF
00C6 3EFF           230          MVI  A,0FFH
00C8 320000    E    231 GETB1:   STA  XTOG
00CB 78             232          MOV  A,B
00CC C9             233          RET
00CD AF             234 XDTF:    XRA  A
00CE C3C800    C    235          JMP  GETB1
                    236
                    237 ;***********************************************
                        ********************
                    238 ;DECIMAL SUBTRACTION-- SUBTRACTS DE FROM BC AND
                        PUTS RESULT INTO HL.
00D1 37             239 DECR:    STC
00D2 3E99           240          MVI  A,99H
00D4 CE00           241          ACI  0
```

```
00D6 93               242         SUB  E
00D7 81               243         ADD  C
00D8 27               244         DAA
00D9 6F               245         MOV  L,A
00DA 3E99             246         MVI  A,99H
00DC CE00             247         ACI  0
00DE 92               248         SUB  D
00DF 80               249         ADD  B
00E0 27               250         DAA
00E1 67               251         MOV  H,A
00E2 C9               252         RET
                      253
                      254 ;**************** W A I T   F O R   E N T E R ****
                          **************************
00E3 E1               255 WENT:   POP  H
00E4 2282B4           256         SHLD ENADR
00E7 C3FD01    C      257         JMP  RKOVER
                      258 ;****** R E M O T E   K E Y B O A R D   M A I N  P
                          R O G R A M *******
                      259
                      260 ;SECTION OF REMOTE PROCESSING THAT HANDLES INPUT
                          AND
                      261 ;FORMATS OUTPUT
00EA 3A58B4           262 RKIST:  LDA  RKINP
00ED B7               263         ORA  A
00EE C25C01    C      264         JNZ  RKOK            ;JMP IF GOOD INPUT
00F1 AF               265         XRA  A
00F2 3E80             266         MVI  A,80H
00F4 D321             267         OUT  RPDA            ;RESET INTERRUPT LATCH J
                          UST IN CASE
00F6 215AB4           268         LXI  H,RKBCT         ;TIME TO CHECK FOR ROTAT
                          E?
00F9 35               269         DCR  M
00FA C0               270         RNZ                  ;I GUESS NOT
00FB 3A60B4           271         LDA  RKWAIT
00FE 325AB4           272         STA  RKBCT           ;RESET COUNTER
0101 3A59B4           273         LDA  RKFLG
0104 E610             274         ANI  10H
0106 C8               275         RZ                   ;RETURN IF NOT ROTATING
0107 0E10             276         MVI  C,16
0109 2149B4           277         LXI  H,RKDB+1
010C 1148B4           278         LXI  D,RKDB
010F 7E               279 RKRLP:  MOV  A,M
0110 12               280         STAX D               ;MOVE MESSAGE LEFT ONE C
                          HARACTER
0111 23               281         INX  H
0112 13               282         INX  D
0113 0D               283         DCR  C
0114 C20F01    C      284         JNZ  RKRLP
0117 2A5DB4           285         LHLD RKRPSV          ;POINTER TO MESSAGE POSI
                          TION
011A 7E               286         MOV  A,M
011B 3257B4           287         STA  RKDB+15         ;PUT NEW CHARACTER INTO
                          LAST SLOT
011E FE2D             288         CPI  '-'
0120 CA2A01    C      289         JZ   RKDASH          ;JMP IF END OF MESSAGE
0123 23               290         INX  H
0124 225DB4           291         SHLD RKRPSV          ;BUMP POINTER TO NEXT CH
                          ARACTER
0127 C34A04    C      292         JMP  RKMOUT          ;GO OUTPUT MESSAGE
                      293 ;
012A 2159B4           294 RKDASH: LXI  H,RKFLG
012D 7E               295         MOV  A,M
012E E620             296         ANI  20H
0130 CA4A01    C      297         JZ   RKIST           ;JP IF FIRST OF 8 DASHES
0133 215FB4           298         LXI  H,RKDCT
0136 35               299         DCR  M               ;DASH COUNTER
0137 C24A04    C      300         JNZ  RKMOUT
013A 2A5BB4           301         LHLD RKMSV           ;START OF MESSAGE
013D 225DB4           302         SHLD RKRPSV          ;UPDATE ROTATING POINTER
```

```
                          TO TOP
0140 215984       303           LXI  H,RKFLG
0143 7E           304           MOV  A,M
0144 E6DF         305           ANI  0DFH
0146 77           306           MOV  M,A           ;CLEAR DASH MODE FLAG
0147 C34A04   C   307           JMP  RKMOUT
                  308 ;
014A 7E           309 RK1ST:    MOV  A,M
014B F620         310           ORI  20H
014D 77           311           MOV  M,A           ;SET DASH MODE FLAG
014E 3E08         312           MVI  A,8
0150 325FB4       313           STA  RKDCT         ;DASH COUNT
0153 C34A04   C   314           JMP  RKMOUT
                  315
                  316 ;**************VECTORS FOR NON-USABLE FUNCTIONS
                      ******************
                  317
0156 219B08   C   318 DUMMY:    LXI  H,RKNOT
0159 C34605   C   319           JMP  RKLMOT
0156          C   320 RKLOT     EQU  DUMMY
0156          C   321 RKMAP     EQU  DUMMY
                  322
                  323 ;************VALID INPUT CHARACTER *************
                      *********************
                  324
015C E61F         325 RKOK:     ANI  1FH           ;CLEAR OUT ALL BUT CHARA
                                                   CTER
015E 4F           326           MOV  C,A           ;SAVE IN C FOR LATER
015F D60A         327           SUI  0AH
0161 D27501   C   328           JNC  RKNO          ;JMP IF NOT NUMERIC INPU
                                                   T
0164 21FD01   C   329           LXI  H,RKOVER
0167 EB           330           XCHG
0168 2A7EB4       331           LHLD NOADR         ;COMPARE NUM. VECTOR WIT
                                                   H EXIT ADD.
016B 7C           332           MOV  A,H
016C 92           333           SUB  D
016D C27501   C   334           JNZ  RKNO
0170 7D           335           MOV  A,L
0171 93           336           SUB  E
0172 CAFD01   C   337           JZ   RKOVER        ;GET OUT IF NUMERIC NOT
0175 215984       338 RKNO:     LXI  H,RKFLG
0178 7E           339           MOV  A,M
0179 E6EF         340           ANI  0EFH          ;CLEAR ROTATE BIT
017B 77           341           MOV  M,A
017C 79           342           MOV  A,C
017D D60A         343           SUI  0AH
017F DAD801   C   344           JC   RKNUM         ;JMP IF NUMBER ENTERED
0182 5F           345           MOV  E,A
0183 0600         346           MVI  B,0
0185 7E           347           MOV  A,M
0186 E602         348           ANI  2             ;CHECK COMMAND STATUS BI
0188 CA8D01   C   349           JZ   RK2
018B 060A         350           MVI  B,10
018D 7E           351 RK2:      MOV  A,M
018E E6FD         352           ANI  0FDH          ;CLEAR COMMAND BIT
0190 77           353           MOV  M,A
                  354 ;              CALCULATE OFFSET TO FUNCTION JUM
                                     P TABLE
0191 7B           355           MOV  A,E
0192 80           356           ADD  B
0193 17           357           RAL
0194 5F           358           MOV  E,A
0195 1600         359           MVI  D,0
0197 21A001   C   360           LXI  H,RKJTB
019A 19           361           DAD  D
019B 5E           362           MOV  E,M
019C 23           363           INX  H
019D 56           364           MOV  D,M
019E EB           365           XCHG
```

```
019F E9              366         PCHL
01A0 5F02      C     367 RKJTB:  DW RKCMD        ;COMMAND
01A2 7A02      C     368         DW RKCL         ;CLEAR
01A4 5601      C     369         DW RKLOT        ;NEWLOT
01A6 2D04      C     370         DW RKWNO        ;WAFER NUMBER
01A8 BF02      C     371         DW RKLDN        ;LOAD NUMBER
01AA 5004      C     372         DW RKEOW        ;END OF WAFER
01AC 5601      C     373         DW RKMAP        ;MAP ON/OFF
01AE 6202      C     374         DW RKENT        ;ENTER
01B0 F203      C     375         DW RKDIS        ;DISPLAY
01B2 B402      C     376         DW RKRF         ;REFERENCE
01B4 5F02      C     377         DW RKCMD        ;COMMAND
01B6 7A02      C     378         DW RKCL         ;CLEAR
01B8 8003      C     379         DW RKRC         ;ROW/COLUMN
01BA 8003      C     380         DW RKRC         ;ROW/COLUMN
01BC 6505      C     381         DW RKPGN        ;PROGRAM NUMBER
01BE 4A06      C     382         DW RKLST        ;LAST=
01C0 8207      C     383         DW RKFNCB       ;FUNCTION B
01C2 7506      C     384         DW RKSTO        ;STORE
01C4 5307      C     385         DW SCRUB        ;SCRUB FUNCTION (FUNCTIO
                         N A)
01C6 AC07      C     386         DW RKFNCC       ;FUNCTION C
01C8 DF              387 RKADTB: DB 0DFH         ;I/O ADDRESSES FOR DISPL
                         AY CHARACTERS

01C9 DE              388         DB 0DEH
01CA DD              389         DB 0DDH
01CB DC              390         DB 0DCH
01CC EF              391         DB 0EFH
01CD EE              392         DB 0EEH
01CE ED              393         DB 0EDH
01CF EC              394         DB 0ECH
01D0 F7              395         DB 0F7H
01D1 F6              396         DB 0F6H
01D2 F5              397         DB 0F5H
01D3 F4              398         DB 0F4H
01D4 FB              399         DB 0FBH
01D5 FA              400         DB 0FAH
01D6 F9              401         DB 0F9H
01D7 F8              402         DB 0F8H
01D8 3A5984          404 RKNUM:  LDA RKFLG
01DB E640            405         ANI 40H
01DD C48F02    C     406         CNZ RKASC1
01E0 2A7E84          407         LHLD NOADR
01E3 E9              408         PCHL            ;JUMP TO SELECTED NUMERI
                         C HANDLER
                     409 ;
                     410 ;INPUT 12 DIGIT IDENTIFIER.
                     411 ;
01E4 218484          412 RKIDIN: LXI H,ASFL
01E7 7E              413         MOV A,M
01E8 B7              414         ORA A
01E9 CAF601    C     415         JZ RKBYP
                     416                         ;SET UP ID MESSAGE IF 1ST TIME
01EC 3600            417         MVI M,0
01EE C5              418         PUSH B
01EF 211F09    C     419         LXI H,RKWIM
01F2 CD3F05    C     420         CALL RKLDOT
01F5 C1              421         POP B
01F6 3E0F            422 RKBYP:  MVI A,15
01F8 060C            423         MVI B,12
01FA CD2702    C     424         CALL RKNUEN     ;INPUT 12 DIGITS
01FD AF              425 RKOVER: XRA A
01FE 325884          426         STA RKINP
0201 3E80            427         MVI A,80H
0203 D321            428         OUT RPDA        ;RESET INTERRUPT LATCH
0205 C9              429         RET
0206 3E0D            430 RKINU:  MVI A,13
0208 C31702    C     431         JMP RKDOUT
```

```
0208 3E08             432 RKRNU:  MVI  A,8      ;ROW # OFFSET
020D C31702    C      433          JMP  RKDOUT
0210 3E0E             434 RKCNU:  MVI  A,14                 ;COLUMN OFFSET
0212 C31702    C      435          JMP  RKDOUT
0215 3E0B             436 RKWNU:  MVI  A,11                 ;WAFER # OFFSET
0217 0603             437 RKDOUT: MVI  B,3       ;3 DIGITS TO INPUT
0219 CD2702    C      438          CALL RKNUEN   ;GO OUTPUT NUMBER
021C C3FD01    C      439          JMP  RKOVER   ;CLEAN UP AND GET OUT
                      440 ;*********** B C D CONVERSION *****************
                          *
                      476 ;OUTPUT CHARACTER AT ADDRESS IN HL TO POSITION I
                          NDICATED BY
                      477 ;ADDRESS IN DE.
                      478 ;
0249 C5               479 DOUT:   PUSH B
024A 1A               480          LDAX D
024B D320             481          OUT  RPDS                ;ENABLE CHIP
024D 7E               482          MOV  A,M
024E D321             483          OUT  RPDA                ;CHARACTER
0250 1A               484          LDAX D        ;GET LAST ADDR.COMMAND
0251 E6BF             485          ANI  0BFH
0253 D320             486          OUT  RPDS                ;ENABLE WRITE
0255 F63C             487          ORI  3CH
0257 D320             488          OUT  RPDS                ;CHIP ENABLE OFF
0259 F640             489          ORI  40H
025B D320             490          OUT  RPDS                ;WRITE OFF
025D C1               491          POP  B
025E C9               492          RET
                      493
                      494 ;*********** "C O M M A N D"  E N T R Y :******
                          *********
                      495
025F 215934           496 RKCMD:  LXI  H,RKFLG
0262 7E               497          MOV  A,M
0263 E640             498          ANI  40H
0265 C28702    C      499          JNZ  RKASC
0268 7E               500          MOV  A,M
0269 F602             501          ORI  2
026B 77               502          MOV  M,A      ;SET COMMAND STATUS BIT
026C 210808    C      503          LXI  H,RKCM
026F CD3F05    C      504 RKLNO:   CALL RKLDOT
0272 C3FD01    C      505          JMP  RKOVER
                      507 ;*********** ERROR MESSAGE ENTRY FOR PLM PROGRAM
                          S ********
                      508
0275 60               509 RKERTM: MOV  H,B
0276 69               510          MOV  L,C
0277 C38102    C      511          JMP  RKERM
                      512
                      513 ;****************"C L E A R"  E N T R Y *******
                          ********
                      514
027A 211808    C      515 RKCL:   LXI  H,RKCLM
027D AF               516          XRA  A
027E 325934           517          STA  RKFLG
0281 CD3F05    C      518 RKERM:  CALL RKLDOT
0284 C39604    C      519          JMP  RKCFLG
                      520 ;
                      521 ;*********** A S C I I  E N T R Y   S U B R O
                          U T I N E S ******
                      522
                      523 ;
0287 3E02             524 RKASC:  MVI  A,2
0289 3261B4           525          STA  RKAF
028C C3FD01    C      526          JMP  RKOVER
028F 3A61B4           527 RKASC1: LDA  RKAF
0292 B7               528          ORA  A
0293 C8               529          RZ
0294 3D               530          DCR  A
```

```
0295 326184        531          STA RKAF
0298 79            532          MOV A,C
0299 CAA502   C    533          JZ RK2D
029C F630          534          ORI 30H
029E 326384        535          STA RKSAV+1
02A1 E1            536          POP H              ;ADJUST STACK
02A2 C3FD01   C    537          JMP RKOVER
02A5 F630          538 RK2D:    ORI 30H
02A7 326484        539          STA RKSAV+2

02AA 216284        540          LXI H,RKSAV
02AD CD920A   C    541          CALL CONAH         ;CONVERT TO 1 ASCII CHAR
                                                    ACTER
02B0 D630          542          SUI 30H            ;CONVERT TO BCD
02B2 4F            543          MOV C,A
02B3 C9            544          RET
                   545
                   546 ;:*********** "R E F E R E N C E" E N T R Y **
                       **************
                   547
02B4 216784        548 RKRF:    LXI H,RROW
02B7 3E52          549          MVI A,'R'
02B9 CD0505   C    550          CALL RKFDSP
02BC C3FD01   C    551          JMP RKOVER
                   552
                   553 ;*************** "L O A D =" E N T R Y ********
                       **************
                   554
02BF 210602   C    555 RKLDN:   LXI H,RKINU
02C2 227E84        556          SHLD NOADR         ;POINTER FOR NUM
                                                    ERIC INPUT
02C5 210F09        557          LXI H,RKIDM
02C8 CDED04   C    558          CALL RKMTOD
02CB 215384        559          LXI H,RKDB+11
02CE 3A7484        560          LDA SCTID
02D1 CD6D0A   C    561          CALL CONHA         ;CONVERT TO ASCII
02D4 CDC704   C    562          CALL RKLINE
02D7 CDE300   C    563          CALL WENT          ;GO WAIT FOR ENTER
02DA 215384        564          LXI H,RKDB+11
02DD CD920A   C    565          CALL CONAH         ;CONVERT ASCII TO HEX
02E0 DA9D03   C    566          JC RKNON           ;TID GREATER THAN 255
02E3 327484        567          STA SCTID
02E6 219684        568          LXI H,RAMER
02E9 B7            569          ORA A
02EA CAF902   C    570          JZ RKMTCH          ;USE RAM IF TID=0
02ED CD7404   C    571          CALL FLST          ;FIND MATCH OR 1ST EMPTY
                                                    SLOT
02F0 CAF902   C    572          JZ RKMTCH          ;FOUND MATCH
02F3 210F08   C    573          LXI H,RKQM
02F6 C38102   C    574          JMP RKERM          ;GO TYPE ERROR MESSAGE
02F9 23            575 RKMTCH:  INX H
02FA 23            576          INX H
02FB 23            577          INX H
02FC E5            578          PUSH H
02FD 211F09   C    579          LXI H,RKWIM
0300 CDED04   C    580          CALL RKMTOD        ;'ID=------------ '
0303 114B84        581          LXI D,RKDB+3
0306 E1            582          POP H              ;HL=START OF WAFER TYPE
                                                    ADDRESS
0307 0E0C          583          MVI C,12
0309 7E            584 RKLUP8:  MOV A,M
030A 12            585          STAX D
030B 23            586          INX H
030C 13            587          INX D
030D 0D            588          DCR C
030E C20903   C    589          JNZ RKLUP8
0311 7E            590          MOV A,M
0312 326784        591          STA RROW
0315 23            592          INX H
0316 7E            593          MOV A,M
```

```
0317 326884        594           STA  RCOL
031A 23            595           INX  H              ;HL SHOULD NOW BE AT FIR
                        ST CODE (A START CODE)
031B 227A84        596           SHLD SCPTR
031E 110400        597           LXI  D,4
0321 19            598           DAD  D
0322 7E            599           MOV  A,M
0323 327184        600           STA  CCOL
0326 23            601           INX  H
0327 7E            602           MOV  A,M
0328 327084        603           STA  CROW
032B 23            604           INX  H
032C 23            605           INX  H
032D 227884        606           SHLD SCSPT
0330 7E            607           MOV  A,M
0331 326C84        608           STA  SCOL
0334 23            609           INX  H
0335 7E            610           MOV  A,M
0336 326884        611           STA  SROW
0339 CDC704     C  612           CALL RKLINE         ;OUTPUT WAFER TYPE
033C CDE300     C  613           CALL WENT
033F 21CF08     C  614 COM:      LXI  H,SWCHM
0342 CDED04     C  615           CALL RKMTOD                     ;SWITCH SETTING
                        MESSAGE
0345 2A7A84        616           LHLD SCPTR
0348 0E0F          617           MVI  C,0FH
034A 115784        618           LXI  D,RKDB+15      ;SET UP DIGIT SWITCH MES
                        SAGE DATA
034D 7E            619           MOV  A,M
034E A1            620           ANA  C
034F F630          621           ORI  30H
0351 12            622           STAX D
0352 1B            623           DCX  D
0353 1B            624           DCX  D
0354 23            625           INX  H
0355 0603          626           MVI  B,3
0357 7E            627 L1:       MOV  A,M
0358 A1            628           ANA  C
0359 F630          629           ORI  30H
035B 12            630           STAX D
035C 1B            631           DCX  D
035D 23            632           INX  H
035E 05            633           DCR  B
035F C25703     C  634           JNZ  L1
0362 114EB4        635           LXI  D,RKDB+6
0365 2A7A84        636           LHLD SCPTR
0368 CD8A04     C  637           CALL SHR4
036B 1B            638           DCX  D
036C 0603          639           MVI  B,3
036E CD8A04     C  640 L2:       CALL SHR4
0371 05            641           DCR  B
0372 C26E03     C  642           JNZ  L2
0375 3A0000     E  643           LDA  METRIC
0378 1F            644           RAR
0379 D28803     C  645           JNC  L3             ;JMP IF NOT METRIC DIMEN
                        SIONS
037C 214884        646           LXI  H,RKDB+3
037F CD9403     C  647           CALL SPEK           ;MOVE DECIMAL POINT FOR
                        DISPLAY
0382 215484        648           LXI  H,RKDB+12
0385 CD9403     C  649           CALL SPEK
0388 2A7884        650 L3:       LHLD SCSPT
038B 227A84        651           SHLD SCPTR
038E CDC704     C  652           CALL RKLINE
0391 C39604     C  653           JMP  RKCFLG
0394 7E            654 SPEK:     MOV  A,M
0395 362E          655           MVI  M,'.'
0397 23            656           INX  H
0398 46            657           MOV  B,M
0399 77            658           MOV  M,A
```

```
039A 23              659           INX  H
039B 70              660           MOV  M,B
039C C9              661           RET
                     662 ;
                     663 ;************ DISPLAY ??????????????? ON KEYB
                         OARD **********
                     664
039D 210F08    C     665 RKNON:    LXI  H,RKQM
03A0 C36F02    C     666           JMP  RKLNO
                     667
                     668 ;******** P L M  ENTRY FOR SETTING UP PROG AUTO
                         POINTERS ********
                     669
03A3 2A7884          670 SETUP:    LHLD SCSPT
03A6 11F9FF          671           LXI  D,0FFF9H
03A9 19              672           DAD  D
03AA 227A84          673           SHLD SCPTR
03AD C33F03    C     674           JMP  COM
03B0 C5              675 RKRC:     PUSH B
03B1 CDB402    C     676           CALL RKRF           ;PRINT REFERENCE MESSAGE
03B4 C1              677           POP  B
03B5 79              678           MOV  A,C            ;RESTORE INPUT CHARACTER
                         TO A-REG
03B6 FE0C            679           CPI  0CH
03B8 210B02    C     680           LXI  H,RKRNU        ;ROW INPUT ADDRESS
03BB CAC103    C     681           JZ   RKBLR          ;JMP IF ROW
03BE 211002    C     682           LXI  H,RKCNU        ;COL INPUT ADDRESS
03C1 227EB4          683 RKBLR:    SHLD NOADR          ;VECTOR FOR NUMERIC INPU
                         T
03C4 CDE300    C     684           CALL WENT           ;GO WAIT FOR NUMERIC OR
                         ENTER
03C7 216784          685           LXI  H,RROW
03CA CDA004    C     686           CALL RKUDSP         ;MOVR REF R/C TO RROW &
                         RCOL
03CD 3A6B84          687           LDA  SROW
03D0 87              688           ORA  A
03D1 CAE303    C     689           JZ   ATREF          ;JUMP IF AT REFERENCE R/
                         C
03D4 3A6784          690           LDA  RROW
03D7 326984          691           STA  PROW
03DA 3A6884          692           LDA  RCOL
03DD 326A84          693           STA  PCOL           ;UPDATE PRESENT R/C
03E0 C39604    C     694           JMP  RKCFLG
03E3 3A6984          695 ATREF:    LDA  PROW
03E6 326B84          696           STA  SROW
03E9 3A6A84          697           LDA  PCOL
03EC 326C84          698           STA  SCOL
03EF C39604    C     699           JMP  RKCFLG         ;UPDATE START R/C
                     700
                     701 ;*********** "D I S P L A Y"  E N T R Y ********
                         *************
                     702
03F2 215984          703 RKDIS:    LXI  H,RKFLG        ;DISPLAY FLIPFLOP
03F5 7E              704           MOV  A,M
03F6 E601            705           ANI  1
03F8 C20404    C     706           JNZ  LORM           ;GO DISPLAY AUTO MODE
03FB 7E              707           MOV  A,M
03FC 3C              708           INR  A
03FD 77              709           MOV  M,A
03FE CD3405    C     710 RCM:      CALL RKRCU          ;DISPLAY ROW/COL
0401 C3FD01    C     711           JMP  RKOVER
0404 7E              712 LORM:     MOV  A,M
0405 3D              713           DCR  A
0406 77              714           MOV  M,A
0407 3A0000    E     715           LDA  MODEM
040A FE05            716           CPI  ESA
040C C21504    C     717           JNZ  DPRA
040F 213B08    C     718           LXI  H,RKESAM
0412 C36F02    C     719           JMP  RKLNO
0415 FE03            720 DPRA:     CPI  PRA
```

```
0417 C2FE03   C   721           JNZ   RCM
041A 21EF08   C   722           LXI   H,RKAM
041D C36F02   C   723           JMP   RKLNO
                  724
                  725  ;*************** "W A F E R  #"   E N T R Y ****
                       ***********
                  726
0420 211502   C   727  RKWNO:   LXI   H,RKWNU
0423 227E84       728           SHLD  NOADR
0426 CD3804   C   729           CALL  RKWAF        ;OUTPUT WAFER NUMBER
0429 CDE300   C   730           CALL  WENT         ;WAIT FOR WAFER# AND ENT
                                                    ER
042C 215184       731           LXI   H,RKDB+9
042F CD920A   C   732           CALL  CONAH        ;CONVERT ASCII TO HEX
0432 DA9D03   C   733           JC    RKNON        ;NUMBER > 255
0435 327384       734           STA   WAFNO
0438 C39604   C   735           JMP   RKCFLG
043B 215808   C   736  RKWAF:   LXI   H,RKWM
043E CDED04   C   737           CALL  RKMTOD
0441 215184       738           LXI   H,RKDB+9
0444 3A7384       739           LDA   WAFNO
0447 CD6D0A   C   740           CALL  CONHA
044A CDC704   C   741  RKMOUT:  CALL  RKLINE
044D C3FD01   C   742           JMP   RKOVER
                  744  ;*********** "E N D  O F  W A F E R"  E N T R Y
                       ********
                  745
0450 214808   C   746  RKEOW:   LXI   H,RKEM
0453 CD6F02   C   747           CALL  RKLNO
0456 CDE300   C   748           CALL  WENT
0459 CDBA04   C   749           CALL  RKOMD
045C CD0000   E   750           CALL  EOW
045F C39604   C   751           JMP   RKCFLG
                  752
                  753  ;************* "E N T E R"   E N T R Y **********
                       *******
                  754
0462 3A5984       755  RKENT:   LDA   RKFLG
0465 E6BF         756           ANI   0BFH
0467 325984       757           STA   RKFLG        ;CLEAR ASCII FLAG
046A 21FD01   C   758           LXI   H,RKOVER
046D 227E84       759           SHLD  NOADR
0470 2A8284       760           LHLD  ENADR
0473 E9           761           PCHL
                  762
                  763  ;******** LOOK FOR MATCH OF TID WITH "A" REG.
                  764  ;         START SEARCH AT ADDRESS IN "HL".
0474 2108C0       765  FLST:    LXI   H,SCTAB
0477 BE           766  RKLKA:   CMP   M
0478 C8           767           RZ
0479 23           768           INX   H
047A 5E           769           MOV   E,M          ;GET ADDRESS OF NEXT TES
                                                    T
047B 23           770           INX   H
047C 56           771           MOV   D,M
047D EB           772           XCHG               ;ADDRESS OF NEXT TEST IN
                                                    TO HL
047E 47           773           MOV   B,A
047F 7E           774           MOV   A,M
0480 FEFF         775           CPI   0FFH
0482 78           776           MOV   A,B
0483 C27704   C   777           JNZ   RKLKA        ;GO LOOK FOR MATCH AGAIN
0486 3E01         778           MVI   A,1
0488 87           779           ORA   A
0489 C9           780           RET
                  781
                  782  ;************** GET Y DIGIT, ISOLATE IT, CONVERT
                       IT TO ASCII, &
                  783  ;              UPDATE PROGRAM TABLE POINTERS.
```

```
048A 7E        784 SHR4:   MOV A,M
048B 1F        785         RAR
048C 1F        786         RAR
048D 1F        787         RAR
048E 1F        788         RAR

048F A1        789         ANA C
0490 F630      790         ORI 30H
0492 12        791         STAX D
0493 1B        792         DCX D
0494 23        793         INX H
0495 C9        794         RET
               795
               796 ;********* KEYBOARD DATA RESET SUBROUTINE ******
                   ************
               797
0496 AF        798 RKCFLG: XRA A
0497 326184    799         STA RKAF          ;RESET ASCII FLAG
049A CD4500  C 800         CALL RKCLR        ;RESET VECTORS TO DEFAUL
                   T LOCATIONS
049D C3FD01  C 801         JMP RKOVER
04A0 E5        806 RKUDSP: PUSH H
04A1 214E84    807         LXI H,RKDB+6
04A4 CD920A  C 808         CALL CONAH        ;CONVERT ASCII TO HEX
04A7 E1        809         POP H
04A8 DA9D03  C 810         JC RKNON
04AB 77       811         MOV M,A
04AC 23       812         INX H
04AD E5       813         PUSH H
04AE 215484   814         LXI H,RKDB+12
04B1 CD920A  C 815         CALL CONAH
04B4 E1       816         POP H
04B5 DA9D03  C 817         JC RKNON
04B8 77       818         MOV M,A
04B9 C9       819         RET
              820 ;
              821 ; A RINKY DINK SR TO BLANK OUT A "?" IN POSITION
                    10 OF DISPLAY
              822 ;
04BA 215284   823 RKQMD:  LXI H,RKDB+10
04BD 3E20     824         MVI A,20H
04BF 77       825         MOV M,A           ;BLANK OUT ?
04C0 110201 C 826         LXI D,RKADTB+10
04C3 CD4902 C 827         CALL DOUT         ;OUTPUT BLANK
04C6 C9       828         RET
              829 ;
              830 ;DISPLAYS THE MESSAGE IN THE OUTPUT BUFFER
              831 ;IF THE FIRST CHARACTER IS AN '/', IT SUBSTITUTE
                   S AN 'A','I', OR 'L'
              832 ;DEPENDING ON WHICH MODE, ATTACHED,INTERNAL, OR
                   LOCAL AS INDICATED BY
              833 ;IOBYT.
              834 ;
04C7 214884   835 RKLINE: LXI H,RKDB
04CA 11C801 C 836         LXI D,RKADTB
04CD 0E10    837          MVI C,16
04CF 7E      838          MOV A,M
04D0 FE2F    839          CPI '/'
04D2 C2E304 C 840         JNZ RKLUP1
04D5 3A66B4   841         LDA IOBYT
04D8 FE01     842         CPI 1
04DA DAFB04 C 843         JC RKL
04DD CA0005 C 844         JZ RKA
04E0 3E4C    845          MVI A,'L'
04E2 77      846 RKLUNK:  MOV M,A
04E3 CD4902 C 847 RKLUP1: CALL DOUT
04E6 13      848          INX D
04E7 23      849          INX H
04E8 0D      850          DCR C
04E9 C2E304 C 851         JNZ RKLUP1
```

```
04EC C9              852         RET
                     853 ;MOVES A 16 CHARACTER MESSAGE INTO THE OUTPUT BU
                         FFER AREA
                     854 ; HL= SOURCE ADDRESS OF MESSAGE
                     855 ; SAVES B TOO.
                     856 ;
04ED 114884          857 RKMTOD:LXI D,RKDB
04F0 0E10            858         MVI C,16
04F2 7E              859 RKLUP6: MOV A,M
04F3 12              860         STAX D
04F4 23              861         INX H
04F5 13              862         INX D
04F6 0D              863         DCR C
04F7 C2F204   C      864         JNZ RKLUP6
04FA C9              865         RET
                     866 ;PART OF RKLINE
                     867 ;
04FB 3E49            868 RKL:    MVI A,'I'
04FD C3E204   C      869         JMP RKLUNK
0500 3E41            870 RKA:    MVI A,'A'
0502 C3E204   C      871         JMP RKLUNK
0505 F5              878 RKFDSP: PUSH PSW
0506 E5              879         PUSH H
0507 212B08   C      880         LXI H,RKRCM
050A CDED04   C      881         CALL RKMTOD
050D E1              882         POP H
050E 7E              883         MOV A,M
050F E5              884         PUSH H
0510 214E84          885         LXI H,RKDB+6
0513 CD6D0A   C      886         CALL CONHA         ;CONVERT TO ASCII
0516 E1              887         POP H
0517 23              888         INX H
0518 7E              889         MOV A,M
0519 215434          890         LXI H,RKDB+12
051C CD6D0A   C      891         CALL CONHA
051F F1              892         POP PSW
0520 214AB4          893         LXI H,RKDB+2
0523 77              894         MOV M,A            ;STORE FUNCTION CHAR.
0524 CDC704   C      895         CALL RKLINE
0527 C9              896         RET
                     897 ;
                     898 ; INTERRUPT HANDLER FOR REMOTE KB ENTRIES
                     899 ;
0528 F3              900 RKINT:  DI
0529 F5              901         PUSH PSW
052A DB20            902         IN IRPDA
052C 3258B4          903         STA RKINP
052F AF              904         XRA A
0530 D321            905         OUT RPDA           ;ACKNOWLEDGE INTERRUPT
0532 F1              906         POP PSW
0533 C9              907         RET
                     908 ;
                     909 ;
                     910 ;   PRINT OUT PRESENT POSITION ON REMOTE DISPLAY
                     911 ;
0534 3E50            912 RKRCU:  MVI A,'P'
0536 D5              913         PUSH D
0537 216984          914         LXI H,PROW
053A CD0505   C      915         CALL RKFDSP
053D D1              916         POP D
053E C9              917         RET
053F CDED04   C      918 RKLDOT: CALL RKMTOD
0542 CDC704   C      919         CALL RKLINE
0545 C9              920         RET
0546 225B84          921 RKLMOT: SHLD RKMSV
0549 211B08   C      922         LXI H,RKCLM        ;CLEAR DISPLAY
054C CDED04   C      923         CALL RKMTOD        ;MOVE MESSAGE TO DISPLAY
                         BUFFER
054F 2A5B84          924         LHLD RKMSV
```

```
0552 225DB4        925         SHLD RKRPSV      ;SAVE PRESENT POSITION O
                                                F LONG MESSAGE
0555 215984        926         LXI H,RKFLG
0558 7E            927         MOV A,M
0559 F610          928         ORI 10H
055B 77            929         MOV M,A          ;SET ROTATE FLAG
055C 3A6084        930         LDA RKWAIT
055F 325AB4        931         STA RKBCT        ;COUNT OF TIME TO WAIT F
                                                OR EACH SHIFT
0562 C34A04    C   932         JMP RKMOUT
                   933 ;
                   934 ;
                   935 ;*************** "P R O G =" E N T R Y *******
                                                **********
                   936 ;THIS SECTION IS A DIALOGUE WITH OPERATOR TO GET
                                                INFO
                   937 ; FOR STARTING TO ENTER A NEW TEST.
                   938 ;
0565 2108C0        939 RKPGN:  LXI H,SCTAB
0568 0600          940         MVI B,0          ;IN CASE THIS IS A NEW E
                                                PROM WITH NOTHING
                   941                          ;IN IT YET.
                   942 ;
                   943 ;GO FIND NEXT UNUSED TEST NUMBER
                   944 ;
056A 7E            945 ENTR2:  MOV A,M
056B FEFF          946         CPI -1
056D CA8A05    C   947         JZ ENTR1
0570 23            948         INX H
0571 5E            949         MOV E,M
0572 23            950         INX H
0573 56            951         MOV D,M
0574 EB            952         XCHG
0575 FE00          953         CPI 0
0577 CA7805    C   954         JZ ENTR3
057A 47            955         MOV B,A
057B 7C            956 ENTR3:  MOV A,H
057C FE20          957         CPI 20H
057E C26A05    C   958         JNZ ENTR2
0581 212F09    C   959         LXI H,MFULM
0584 CD8102    C   960         CALL RKERM
0587 C39604    C   961         JMP RKCFLG
                   962 ;
                   963 ;TYPE OUT NEW TEST NUMBER AND WAIT FOR ENTER.
                   964 ;
058A 2278B4        965 ENTR1:  SHLD SCSPT
058D 214F09    C   966         LXI H,NTIM
0590 CDED04    C   967         CALL RKMTOD
0593 78            968         MOV A,B
0594 3C            969         INR A
0595 328684        970         STA RAMER
0598 215584        971         LXI H,RKDB+13
059B CD6D0A    C   972         CALL CONHA
059E CDC704    C   973         CALL RKLINE
05A1 CDE300    C   974         CALL WENT        ;WAIT FOR ENTER
                   975 ;
                   976 ;ASK FOR IDENTIFIER.
                   977 ;
05A4 21E401    C   978         LXI H,RKIDIN
05A7 227EB4        979         SHLD NOADR
05AA 3A59B4        980         LDA RKFLG
05AD F640          981         ORI 40H
05AF 3259B4        982         STA RKFLG        ;SET ASCII INPUT FLAG
05B2 3284B4        983         STA ASFL         ;FLAG THAT THIS IS 1ST E
                                                NTRY
05B5 215F09    C   984         LXI H,EIDM
05B8 CD4605    C   985         CALL RKLMOT
05BB CDE300    C   986         CALL WENT        ;WAIT FOR ENTER
                   987 ;
```

```
                        988  ;PUT 12 DIGIT IDENTIFIER INTO RAM.
                        989  ;
05BE  2189B4             990        LXI  H,RAMER+3
05C1  0E0C               991        MVI  C,12
05C3  114CB4             992        LXI  D,RKDB+4

05C6  1A                 993 ENTLP: LDAX D
05C7  77                 994        MOV  M,A
05C8  13                 995        INX  D
05C9  23                 996        INX  H
05CA  0D                 997        DCR  C
05CB  C2C605      C      998        JNZ  ENTLP
                        1000  ; SET UP TRIAL REFERENCE:
05CE  3A67B4            1001        LDA  RROW
05D1  77                1002        MOV  M,A
05D2  3269B4            1003        STA  PROW
05D5  23                1004        INX  H
05D6  3A6BB4            1005        LDA  RCOL
05D9  77                1006        MOV  M,A
05DA  326AB4            1007        STA  PCOL
05DD  23                1008        INX  H
05DE  227AB4            1009        SHLD SCPTR
05E1  CD8500      C     1010        CALL FLOP            ;TURN OFF LIGHTS
05E4  2167B4            1011        LXI  H,RROW
05E7  3E52              1012        MVI  A,'R'
05E9  CD0505      C     1013        CALL RKFDSP
05EC  CDE300      C     1014        CALL WENT
05EF  AF                1015        XRA  A
05F0  326584            1016        STA  LSTENT
05F3  218909      C     1017        LXI  H,SETXM
05F6  CD4605      C     1018        CALL RKLMOT
05F9  CDE300      C     1019        CALL WENT
                        1020  ;
                        1021  ; MOVE DIGIT SWITCH STUFF TO RAM.
                        1022  ;
05FC  2A7AB4            1023        LHLD SCPTR
05FF  3EFF              1024        MVI  A,-1
0601  D30A              1025        OUT  INSEL
0603  DB04              1026        IN   INLIN
0605  77                1027        MOV  M,A
0606  3EFE              1028        MVI  A,-2
0608  D30A              1029        OUT  INSEL
060A  DB04              1030        IN   INLIN
060C  23                1031        INX  H
060D  77                1032        MOV  M,A
060E  3EFD              1033        MVI  A,-3
0610  D30A              1034        OUT  INSEL
0612  DB04              1035        IN   INLIN
0614  23                1036        INX  H
0615  77                1037        MOV  M,A
0616  3EFC              1038        MVI  A,-4
0618  D30A              1039        OUT  INSEL
061A  DB04              1040        IN   INLIN
061C  23                1041        INX  H
061D  77                1042        MOV  M,A
061E  23                1043        INX  H
061F  227AB4            1044        SHLD SCPTR
0622  2A67B4            1045        LHLD RROW
0625  2269B4            1046        SHLD PROW
0628  21410A      C     1047        LXI  H,SCRBM

062B  CD4605      C     1048        CALL RKLMOT
062E  CDE300      C     1049        CALL WENT
0631  2A7AB4            1050        LHLD SCPTR
0634  3A6AB4            1051        LDA  PCOL
0637  47                1052        MOV  B,A
0638  77                1053        MOV  M,A
0639  23                1054        INX  H
063A  3A69B4            1055        LDA  PROW
063D  77                1056        MOV  M,A
063E  23                1057        INX  H
```

```
063F 70              1058         MOV M,B
0640 23              1059         INX H
0641 227AB4          1060         SHLD SCPTR
0644 21090A    C     1061         LXI H,STPM
0647 C34605    C     1062         JMP RKLMOT
                     1064 ;******** "L A S T =" E N T R Y ***************
                          *****
                     1065
064A 2A7AB4          1066 RKLST:  LHLD SCPTR
064D 3A85B4          1067         LDA FLIPF
0650 1F              1068         RAR
0651 D25C06    C     1069         JNC LST
0654 3A6AB4          1070         LDA PCDL
0657 77              1071         MOV M,A
0658 23              1072         INX H
0659 CD8500    C     1073         CALL FLOP
065C AF              1074 LST:    XRA A
065D 77              1075         MOV M,A
065E 23              1076         INX H
065F 117A4B          1077         LXI D,RAMEND
0662 19              1078         DAD D
0663 EB              1079         XCHG
0664 2187B4          1080         LXI H, RAMER+1
0667 73              1081         MOV M,E
0668 23              1082         INX H
0669 72              1083         MOV M,D
066A 3E01            1084         MVI A,1
066C 3265B4          1085         STA LSTENT
066F 21FB07    C     1086         LXI H,TEM
0672 C39102    C     1087         JMP RKERM
                     1088 ;******** "S T O R E" E N T R Y ***************
                          *****
0675 210909    C     1089 RKSTO:  LXI H,TNSM
0678 3A0000    E     1090         LDA MODEM
067B FE01            1091         CPI 1
067D C29102    C     1092         JNZ RKERM          ;JMP IF TOGGLES NOT PROP
                                                      ERLY SET
0680 217909    C     1093         LXI H,NDLM
0683 3A65B4          1094         LDA LSTENT
0686 B7              1095         ORA A
0687 CA8102    C     1096         JZ RKERM
068A 21E909    C     1097         LXI H,WEM
068D CD3F05    C     1098         CALL RKLDOT
0690 3EFF            1099         MVI A,-1
0692 CD7404    C     1100         CALL FLST          ;GO FIND FIRST EMPTY SLO
                                                      T
0695 E5              1101         PUSH H             ;SAVE START LOCATION FOR
                                                      LATER
0696 2187B4          1102         LXI H,RAMER+1
0699 5E              1103         MOV E,M
069A 23              1104         INX H
069B 56              1105         MOV D,M            ;MOVE BYTE COUNT INTO DE
069C E1              1106         POP H              ;EPROM START LOCATION
069D E5              1107         PUSH H
069E D5              1108         PUSH D
069F D5              1109         PUSH D             ;SAVE THIS COUNT TWICE F
                                                      OR LATER
06A0 E5              1110         PUSH H             ;SAVE EPROM ADDRESS
06A1 19              1111         DAD D
06A2 EB              1112         XCHG               ;DE NOW HAS NEXT FREE SL
                                                      OT AFTER THIS IS WRITTEN
06A3 2180B4          1113         LXI H,CHKADD
06A6 73              1114         MOV M,E
06A7 23              1115         INX H
06A8 72              1116         MOV M,D
06A9 2187B4          1117         LXI H,RAMER+1
06AC 73              1118         MOV M,E
06AD 23              1119         INX H
06AE 72              1120         MOV M,D            ;POINTER TO NEXT EMPTY S
                                                      LOT
```

```
06AF 3EE0            1121          MVI A,0E0H
06B1 BA              1122          CMP D
06B2 D2C206   C      1123          JNC INRNGE       ;JMP IF ENOUGH ROOM FOR
                                PROGRAM
06B5 E1              1124          POP H
06B6 E1              1125          POP H
06B7 D1              1126          POP D            ;ADJUST STACK
06B8 E1              1127          POP H
06B9 CD4C07   C      1128          CALL RSTCNT      ;RESTORE ORIGINAL COUNT
06BC 212F09   C      1129          LXI H,MFULM
06BF C38102   C      1130          JMP RKERM        ;"MEMORY FULL"
06C2 D1              1131 INRNGE:  POP D            ;DESTINATION OF WRITE TO
                                EPROM
06C3 2B              1132          DCX H
06C4 2B              1133          DCX H            ;ADDRESS OF EPROM DATA
06C5 3E01            1134 REDO:    MVI A,1
06C7 D307            1135          OUT WREP         ;ENABLE EPROM FOR WRITIN
                                G
06C9 7E              1136 INLUP:   MOV A,M
06CA 12              1137          STAX D
06CB D5              1138          PUSH D
06CC 1601            1139          MVI D,1
06CE CD9100   C      1140          CALL DELAY       ;WAIT 1 MSEC
06D1 D1              1141          POP D
06D2 7E              1142          MOV A,M
06D3 12              1143          STAX D           ;WRITE SAME DATA TWICE
06D4 D5              1144          PUSH D
06D5 1696            1145          MVI D,150
06D7 CD9100   C      1146          CALL DELAY       ;WAIT ONE HUNDRED MSEC
06DA D1              1147          POP D
06DB 13              1148          INX D
06DC 23              1149          INX H
06DD C1              1150          POP B            ;REMEMBER THE COUNT PUSH
                                ED WAY BACK THERE?
06DE 0D              1151          DCR C            ;WELL THIS IS IT.
06DF C2E806   C      1152          JNZ INR1         ;JMP IF LEAST SIGNIFICAN
                                T PART NOT ZERO
06E2 AF              1153          XRA A
06E3 B8              1154          CMP B
06E4 CAEC06   C      1155          JZ INROV
06E7 05              1156          DCR B
06E8 C5              1157 INR1:    PUSH B           ;SAVE COUNT
06E9 C3C906   C      1158          JMP INLUP
06EC AF              1159 INROV:   XRA A
06ED D307            1160          OUT WREP         ;TURN OFF WRITE ENABLE
06EF C1              1161          POP B            ;REMEMBER WE SAVED THE C
                                OUNT TWICE
06F0 C5              1162          PUSH B           ;WELL SAVE IT ONCE AGAIN
06F1 3A75B4          1163          LDA SKRUD
06F4 1F              1164          RAR
06F5 D21807   C      1165          JNC INROV1
06F8 AF              1166          XRA A
06F9 3275B4          1167          STA SKRUD
06FC C1              1168          POP B
06FD 2180B4          1169          LXI H,CHKADD
0700 1A              1170          LDAX D
0701 BE              1171          CMP M
0702 C21207   C      1172          JNZ NOGOOD
0705 13              1173          INX D
0706 23              1174          INX H
0707 1A              1175          LDAX D
0708 BE              1176          CMP M
0709 C21207   C      1177          JNZ NOGOOD
070C 21EB07   C      1178          LXI H,BDWRM
070F C38102   C      1179          JMP RKERM
0712 21AF08   C      1180 NOGOOD:  LXI H,BADDIE
0715 C34605   C      1181          JMP RKLMOT
0718 2B              1182 INROV1:  DCX H
0719 1B              1183          DCX D
```

```
071A 1A           1184            LDAX D
071B BE           1185            CMP  M            ;WE NOW GO BACKWARD AND
                          COMPARE WHAT WE WROTE
071C C23707  C    1186            JNZ  INRBAD       ;WHOOPS! A BADDY
071F 0D           1187            DCR  C
0720 C21807  C    1188            JNZ  INROV1       ;GO CHECK SOME MORE
0723 AF           1189            XRA  A
0724 B8           1190            CMP  B
0725 CA2C07  C    1191            JZ   INROK        ;CHECKED THEM ALL
0728 05           1192            DCR  B
0729 C31807  C    1193            JMP  INROV1
072C D1           1194 INROK:     POP  D            ;ADJUST STACK
072D E1           1195            POP  H
072E CD4C07  C    1196            CALL RSTCNT       ;RESTORE ORIGINAL COUNT
0731 21F909  C    1197            LXI  H,MWOK
0734 C38102  C    1198            JMP  RKERM        ;"WRITE COMPLETED"
0737 D1           1199 INRBAD:    POP  D            ;RETRIEVE TEST LENGTH
0738 CD4C07  C    1200            CALL RSTCNT       ;RESTORE ORIGINAL COUNT
073B D1           1201            POP  D
073C D5           1202            PUSH D
073D 218584       1203            LXI  H,FLIPF
0740 3E01         1204            MVI  A,1
0742 327584       1205            STA  SKRUD
0745 4F           1206            MOV  C,A
0746 AF           1207            XRA  A
0747 47           1208            MOV  B,A
0748 C5           1209            PUSH B
0749 C3C506  C    1210            JMP  REDO
                  1211
074C 218784       1212 RSTCNT:    LXI  H,RAMER+1
074F 73           1213            MOV  M,E
0750 23           1214            INX  H
0751 72           1215            MOV  M,D          ;RESTORE ORIGINAL TEST L
                          ENGTH
0752 C9           1216            RET
                  1217
0753 21310A  C    1218 SCRUB:     LXI  H,SCRM
0756 CDED04  C    1219            CALL RKMTOD
0759 3A7284       1220            LDA  CLCNT
075C 215484       1221            LXI  H,RKDB+12
075F CD6D0A  C    1222            CALL CONHA
0762 217D07  C    1223            LXI  H,RKSNU
0765 227E84       1224            SHLD NOADR
0768 CDC704  C    1225            CALL RKLINE
076B CDE300  C    1226            CALL WENT
076E 215484       1227            LXI  H,RKDB+12
0771 CD920A  C    1228            CALL CONAH
0774 DA9D03  C    1229            JC   RKNON
0777 327284       1230            STA  CLCNT
077A C39604  C    1231            JMP  RKCFLG
077D 3E0E         1232 RKSNU:     MVI  A,14
077F C31702  C    1233            JMP  RKDOUT
                  1234 ;
0782 210602  C    1235 RKFNCB:    LXI  H,RKINU
0785 227E84       1236            SHLD NOADR        ;VECTOR FOR NUMERIC ENTR
                          Y
0788 213F09  C    1237            LXI  H,PIDM
078B CDED04  C    1238            CALL RKMTOD
078E 3A7684       1239            LDA  PID
0791 215384       1240            LXI  H,RKDB+11
0794 CD6D0A  C    1241            CALL CONHA
0797 CDC704  C    1242            CALL RKLINE
079A CDE300  C    1243            CALL WENT
079D 215384       1244            LXI  H,RKDB+11
07A0 CD920A  C    1245            CALL CONAH
07A3 DA9D03  C    1246            JC   RKNON
07A6 327684       1247            STA  PID
07A9 C39604  C    1248            JMP  RKCFLG
07AC 21D807  C    1249 RKFNCC:    LXI  H,DM
```

```
07AF CDED04   C  1250           CALL RKMTOD
07B2 3A7CB4      1251           LDA DELAM
07B5 2155B4      1252           LXI H,RKDB+13
07B8 CD6D0A   C  1253           CALL CONHA
07BB CDC704   C  1254           CALL RKLINE
07BE 21D607   C  1255           LXI H,RK15
07C1 227EB4      1256           SHLD NOADR
07C4 CDE300   C  1257           CALL WENT
07C7 2155B4      1258           LXI H,RKDB+13
07CA CD920A   C  1259           CALL CONAH
07CD DA9D03   C  1260           JC RKNON
07D0 327CB4      1261           STA DELAM
07D3 C39604   C  1262           JMP RKCFLG
07D6 3E0F        1263 RK15:     MVI A,15
07D8 C31702   C  1264           JMP RKDOUT
07DB 44454C41    1265 DM:       DB 'DELAY AMOUNT=    '
07DF 5920414D
07E3 4F554E54
07E7 3D202020
07EB 50524F4D    1266 BDWRM:    DB 'PROM WRITE ERROR'
07EF 20575249
07F3 54452045
07F7 52524F52
07FB 20205445    1267 TEM:      DB '   TEST ENTERED  '
07FF 53542045
0803 4E544552
0807 45442020
080B 4320434F    1268 RKCM:     DB 'C COMMAND ?      '
080F 4D4D414E
0813 44203F20
0817 20202020
081B 2F202020    1269 RKCLM:    DB '/                '
081F 20202020
0823 20202020
0827 20202020
082B 2F205020    1270 RKRCM:    DB '/ P R=    C=     '
082F 523D2020
0833 20204333D
0837 20202020
083B 20455320    1271 RKESAM:   DB ' ES   AUTO   MODE '
083F 20415554
0843 4F20204D
0847 4F444420
084B 2F202020    1272 RKEM:     DB '/   E O W ?      '
084F 45204F20
0853 57203F20
0857 20202020
085B 2F202020    1273 RKWM:     DB '/   WAF#         '
085F 57414623
0863 20202020
0867 20202020
086B 2F20204E    1274 RKNM:     DB '/  N E W  L O T '
086F 20452057
0873 20204C20
0877 4F205420
087B 2F202020    1275 RKOM:     DB '/       O N      '
087F 20204F20
0883 4E202020
0887 20202020
088B 2F202020    1276 RKFM:     DB '/       O F F    '
088F 204F2046
0893 20462020
0897 20202020
089B 4E4F5420    1277 RKNOT:    DB 'NOT YET IMPLEMENTED-'
089F 59455420
08A3 494D504C
08A7 454D454E
08AB 5445442D
08AF 42414420    1278 BADDIE:   DB 'BAD EPROM....LOAD NO MORE TESTS-'
08B3 4550524F
```

```
08B7 4D2E2E2E
08BB 2E4C4F41
08BF 44204E4F
08C3 204D4F52
08C7 45205445
08CB 5354532D
08CF 593D2020      1279 SWCHM:   DB 'Y=   . , X=   . '
08D3 202E202C
08D7 20583D20
08DB 20202E20
08DF 3F3F3F3F      1280 RKQM:    DB '????????????????'
08E3 3F3F3F3F
08E7 3F3F3F3F
08EB 3F3F3F3F
08EF 2F202050      1281 RKAM:    DB '/  PROG   AUTO   '
08F3 524F4720
08F7 20415554
08FB 4F202020
08FF 2F202020      1282 RKIM:    DB '/    READY       '
0903 20524541
0907 44592020
090B 20202020
090F 2F205445      1283 RKIDM:   DB '/ TEST ID=       '
0913 53542049
0917 443D2020
091B 20202020
091F 49443D20      1284 RKWIM:   DB 'ID=             '
0923 20202020
0927 20202020
092B 20202020
092F 2F204D45      1285 MFULM:   DB '/ MEMORY   FULL '
0933 4D4F5259
0937 20204655
093B 4C4C2020
093F 50524F42      1286 PIDM:    DB 'PROBER ID =     '
0943 45522049
0947 44203D20
094B 20202020
094F 4E455720      1287 NTIM:    DB 'NEW TEST ID=    '
0953 54455354
095F 454E5445      1288 EIDM:    DB 'ENTER 12 DIGIT IDENTIFIER-'
0963 52203132
0967 20444947
096B 49542049
096F 44454E54
0973 49464945
0977 522D
0979 4E4F204C      1289 NOLM:    DB 'NO LAST= MARKER '
097D 4153543D
0981 204D4152
0985 4B455220
0989 53455420      1290 SETXM:   DB 'SET X & Y DIGIT SWITCHES AND'
098D 58202620
0991 59204449
0995 47495420
0999 53574954
099D 43484553
09A1 20414E44
09A5 20504F53      1291 PREM:    DB ' POSITION AT '
09A9 4954494F
09AD 4E204154
09B1 20
09B2 52454645      1292          DB 'REFERENCE DIE...HIT ''ENTER'' WHEN R
                          EADY-'
09B6 52454E43
09BA 45204449
09BE 452E2E2E
09C2 48495420
09C6 27454E54
09CA 45522720
```

```
09CE 5748454E
09D2 20524541
09D6 44592D
09D9 544F4747    1293 TNSM:   DB 'TOGGLES NOT SET '
09DD 4C455320
09E1 4E4F5420
09E5 53455420
09E9 20575249    1294 WEM:    DB ' WRITING EPROMS '
09ED 54494E47
09F1 20455052
09F5 4F4D5320
09F9 57524954    1295 MWOK:   DB 'WRITE COMPLETED '
09FD 4520434F
0A01 4D504C45
0A05 54454420
0A09 53544550    1296 STPM:   DB 'STEP TO START DIE & HIT STORE ON PRO
                      BER-'
0A0D 20544F20
0A11 53544152
0A15 54204449
0A19 45202620
0A1D 48495420
0A21 53544F52

0A31 53435255    1297 SCRM:   DB 'SCRUB EVERY 0000'
0A35 42204556
0A39 45525920
0A3D 30303030
0A41 53544550    1298 SCRBM:  DB 'STEP TO SCRUB AREA...HIT "ENTER" WHE
                      N READY-'
```

What is claimed is:

1. In a method for scrubbing clean the probe tips of an automatic wafer prober of the type having an array of wafer probes for making electrical contact to pads on the respective die of a wafer with a planar scrubbing surface of an abrasive element disposed off of the wafer, the steps of:
automatically stepping the wafer prober in a sequence to selected die on a wafer for electrically testing the probed die;
automatically cleaning the probe tips by stepping the probe tips and the abrasive element at right angles relative to each other so that in response to the stepping, (a) the probe tips and the planar scrubbing surface contact and (b) while the tips and scrubbing surface contact the tips are deflected onto and along the planar scrubbing surface to produce a rubbing action which cleans the tips without damaging the tips.

2. The method of claim 1 including the steps of;
automatically interrupting the prober sequence after a predetermined number of die have been probed; and
automatically returning the wafer prober to the interrupted prober sequence after scrubbing of the probe tips.

3. The method of claim 2 including the step of selecting the predetermined number of die to be probed before said interruption of the probe sequence as a function of the rate at which the probe tips are expected to be fouled during probing of the particular die under test.

4. The method of claim 1 further including stepping the probe tips onto and along the planar scrubbing surface more than once.

5. In an automatic wafer prober of the type having an array of wafer probes for sequentially making electrical contact to an array of contact pads of each die to be tested on a wafer;
stepping means for automatically stepping the wafer prober in a sequence to selected die on a wafer for electrically testing the probed die; and
scrub block means disposed proximate the wafer for cleaning the probe tips by scrubbing the tips on a planar scrubbing surface of said scrub block means;
said stepping means including means for automatically stepping the probe tips at right angles relative to the scrubbing surface so that in response to the stepping the (a) probe tips and the planar scrubbing surface contact and (b) while the tips and planar scrubbing surface contact the tips are deflected onto and along the planar scrubbing surface to produce a rubbing action which cleans the tips without damaging the tips.

6. The apparatus of claim 5 wherein said scrub block means includes an alignment flat for contact with a flat of the wafer for aligning the wafer in the wafer prober.

7. The apparatus of claim 5 wherein the wafer prober includes;

chuck means for holding the wafer relative to the array of wafer probes; and fastener means for fixedly securing said scrub block means to said chuck means.

8. The apparatus of claim 7 wherein said fastener means positions the scrubbing surface of said scrub block means below the upper surface of the wafer under test.

9. The apparatus of claim 5 including:

interrupting means for automatically interrupting the prober sequence after a predetermined number of die have been probed; and means for automatically returning the wafer prober to the interrupted prober sequence after scrubbing of the probe tips.

10. The apparatus of claim 9 including select means for selecting the predetermined number of die to be probed before interruption of the probe sequence for scrubbing of the probe tips.

* * * * *